United States Patent
Bower et al.

(10) Patent No.: US 11,817,434 B2
(45) Date of Patent: Nov. 14, 2023

(54) DISPLAYS WITH EMBEDDED LIGHT EMITTERS

(71) Applicant: X Display Company Technology Limited, Dublin (IE)

(72) Inventors: Christopher Andrew Bower, Raleigh, NC (US); Matthew Alexander Meitl, Durham, NC (US); Glenn Arne Rinne, New Hill, NC (US); Justin Walker Brown, Raleigh, NC (US); Ronald S. Cok, Rochester, NY (US)

(73) Assignee: X Display Company Technology Limited, Dublin (IE)

(*) Notice: Subject to any disclaimer, the term of this patent is extended or adjusted under 35 U.S.C. 154(b) by 0 days.

(21) Appl. No.: 17/703,135

(22) Filed: Mar. 24, 2022

(65) Prior Publication Data
US 2022/0216189 A1     Jul. 7, 2022

Related U.S. Application Data

(63) Continuation of application No. 16/723,770, filed on Dec. 20, 2019, now Pat. No. 11,315,909.

(51) Int. Cl.
| | |
|---|---|
| *H01L 33/00* | (2010.01) |
| *H01L 25/075* | (2006.01) |
| *H01L 33/62* | (2010.01) |
| *H01L 33/44* | (2010.01) |

(52) U.S. Cl.
CPC ......... *H01L 25/0753* (2013.01); *H01L 33/44* (2013.01); *H01L 33/62* (2013.01)

(58) Field of Classification Search
None
See application file for complete search history.

(56) References Cited

U.S. PATENT DOCUMENTS

| | | |
|---|---|---|
| 6,142,358 A | 11/2000 | Cohn et al. |
| 6,466,281 B1 | 10/2002 | Huang et al. |
| 6,812,637 B2 | 11/2004 | Cok et al. |
| 7,091,523 B2 | 8/2006 | Cok et al. |
| 7,195,733 B2 | 3/2007 | Rogers et al. |
| 7,354,801 B2 | 4/2008 | Sugiyama et al. |
| 7,402,951 B2 | 7/2008 | Cok |

(Continued)

OTHER PUBLICATIONS

Bower, C. A. et al., Emissive displays with transfer-printed assemblies of 8 μm ×15 μm inorganic light-emitting diodes, Photonics Research, 5(2):A23-A29, (2017).

(Continued)

*Primary Examiner* — Bradley Smith
(74) *Attorney, Agent, or Firm* — Choate, Hall & Stewart LLP; Michael D. Schmitt

(57) ABSTRACT

A display comprises a transparent polymer support, an array of light emitters embedded in the support, and a redistribution layer. Each light emitter comprises electrode contacts that are substantially coplanar with a back surface of the support and emits light through a front surface of the support opposite the back surface when provided with power through the electrode contacts. The redistribution layer comprises a dielectric layer that is disposed on and in contact with the support back surface and distribution contacts that extend through the dielectric layer. Each of the distribution contacts is electrically connected to an electrode contact and is at least partially exposed.

12 Claims, 18 Drawing Sheets

(56) References Cited

U.S. PATENT DOCUMENTS

| | | |
|---|---|---|
| 7,466,075 B2 | 12/2008 | Cok et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,919,342 B2 | 4/2011 | Cok |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,333,860 B1 | 12/2012 | Bibl et al. |
| 8,470,701 B2 | 6/2013 | Rogers et al. |
| 8,506,867 B2 | 8/2013 | Menard |
| 8,558,243 B2 | 10/2013 | Bibl et al. |
| 8,722,458 B2 | 5/2014 | Rogers et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 8,941,215 B2 | 1/2015 | Hu et al. |
| 8,987,765 B2 | 3/2015 | Bibl et al. |
| 9,049,797 B2 | 6/2015 | Menard et al. |
| 9,087,764 B2 | 7/2015 | Chan et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,165,989 B2 | 10/2015 | Bower et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,355,854 B2 | 5/2016 | Meitl et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,589,944 B2 | 3/2017 | Higginson et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,818,725 B2 | 11/2017 | Bower et al. |
| 9,865,832 B2 | 1/2018 | Bibl et al. |
| 9,929,053 B2 | 3/2018 | Bower et al. |
| 10,333,042 B1 | 6/2019 | Liu et al. |
| 10,483,253 B1 * | 11/2019 | Hu .......................... H01L 25/50 |
| 10,600,671 B2 * | 3/2020 | Bower ................ H01L 33/0095 |
| 10,700,246 B2 * | 6/2020 | Sim ....................... H01L 27/153 |
| 11,315,909 B2 | 4/2022 | Bower et al. |
| 2003/0141570 A1 | 7/2003 | Chen et al. |
| 2007/0077349 A1 | 4/2007 | Newman et al. |
| 2010/0306993 A1 | 12/2010 | Mayyas et al. |
| 2013/0050227 A1 | 2/2013 | Petersen et al. |
| 2013/0309792 A1 | 11/2013 | Tischler et al. |
| 2013/0316487 A1 | 11/2013 | de Graff et al. |
| 2014/0159043 A1 | 6/2014 | Sakariya et al. |
| 2015/0372053 A1 | 12/2015 | Bower et al. |
| 2016/0093600 A1 | 3/2016 | Bower et al. |
| 2017/0338374 A1 | 11/2017 | Zou et al. |
| 2018/0350871 A1 | 12/2018 | Lee et al. |
| 2020/0287112 A1 | 9/2020 | Li |

OTHER PUBLICATIONS

Bower, C. A. et al., Micro-Transfer-Printing: Heterogeneous Integration of Microscale Semiconductor Devises using Elastomer Stamps, IEEE Conference, (2014).

Bower, C. A. et al., Transfer Printing: An Approach for Massively Parallel Assembly of Microscale Devices, IEEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335-341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

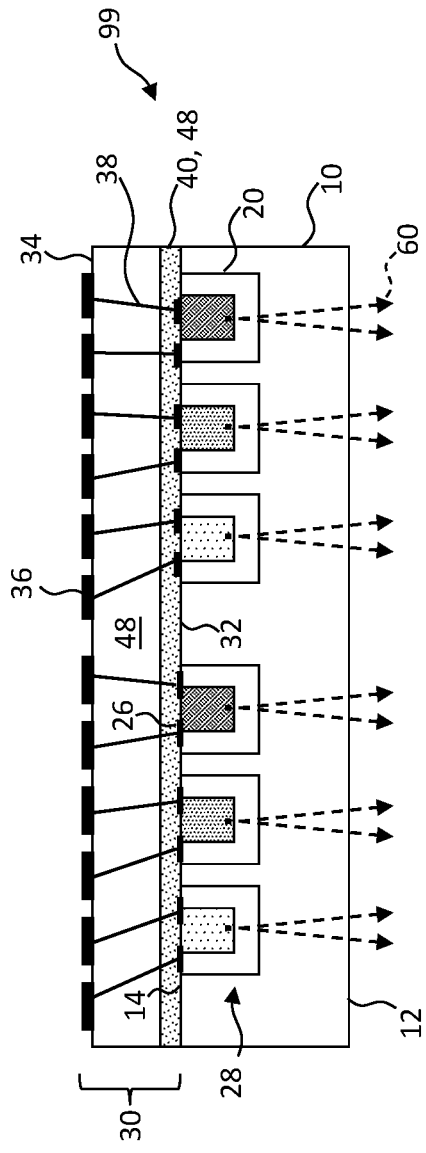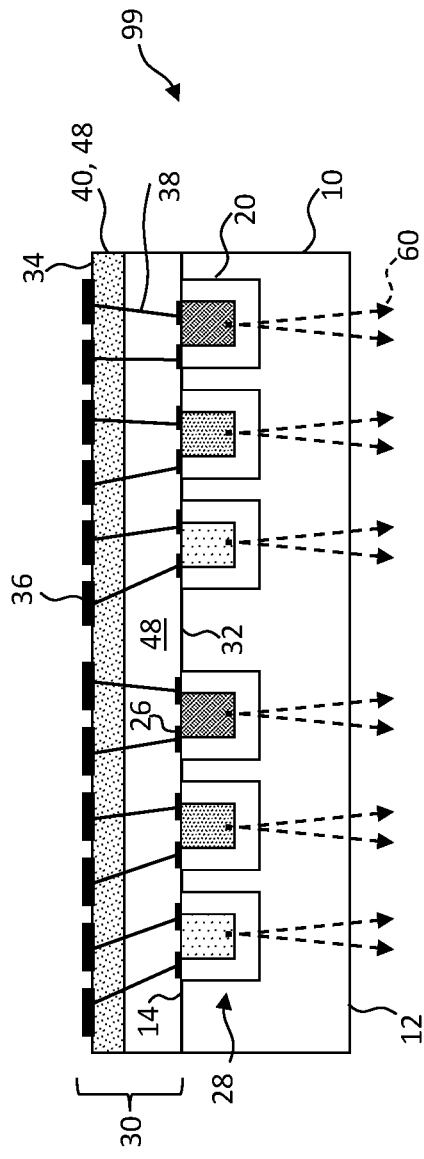

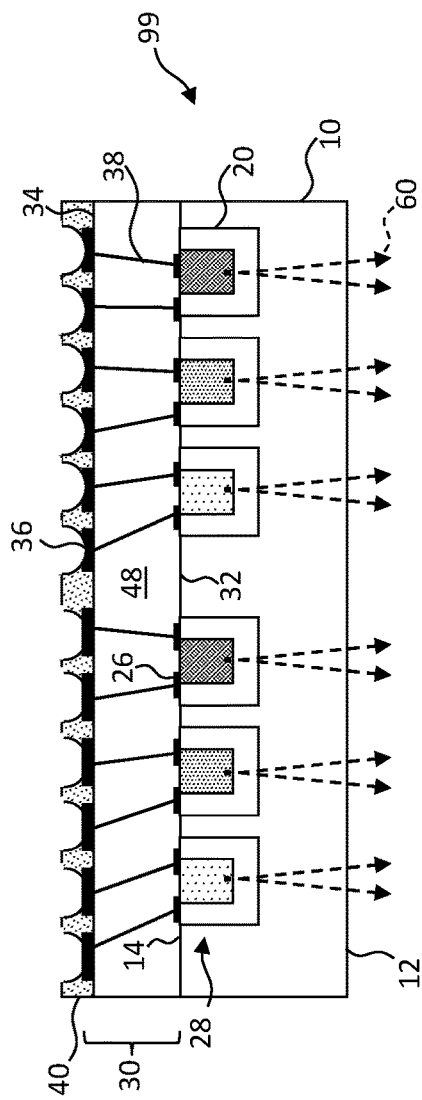
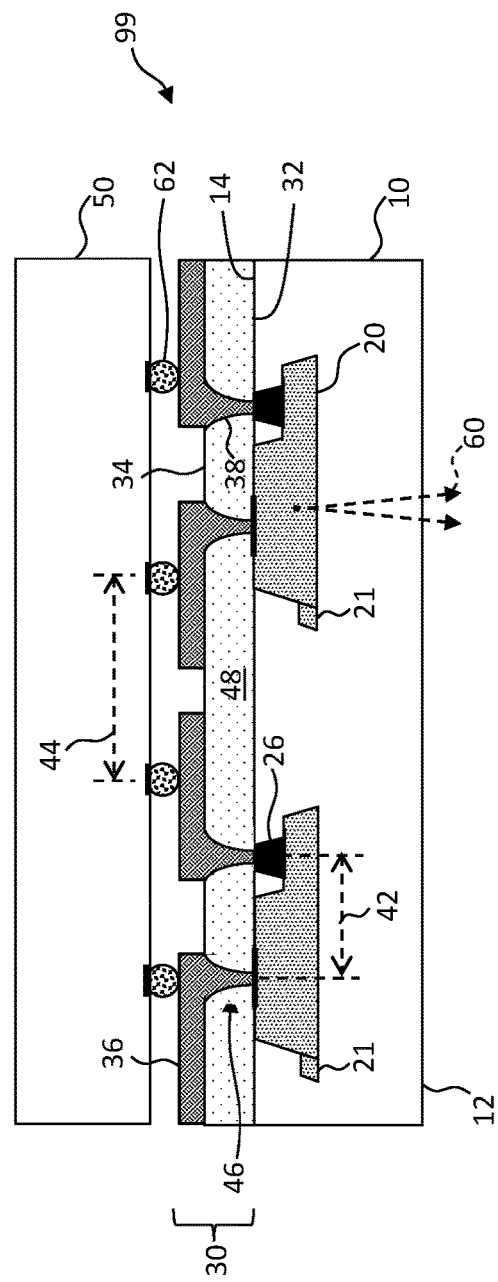

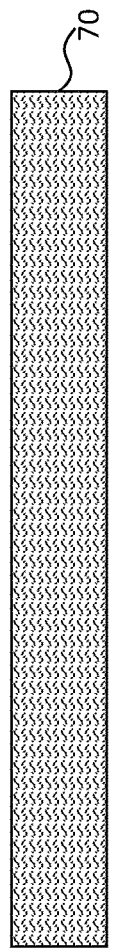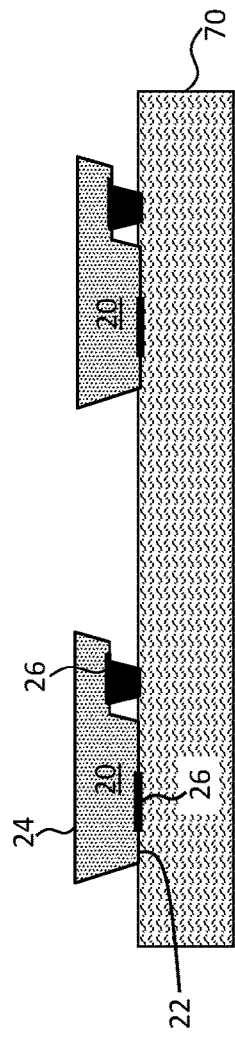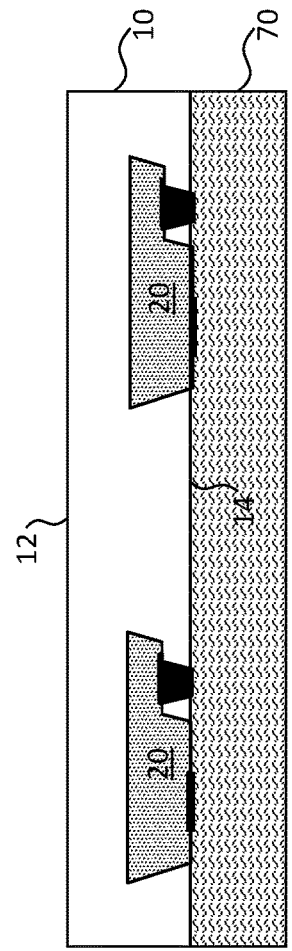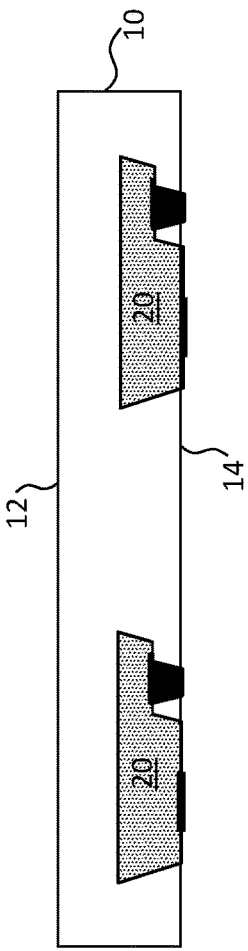

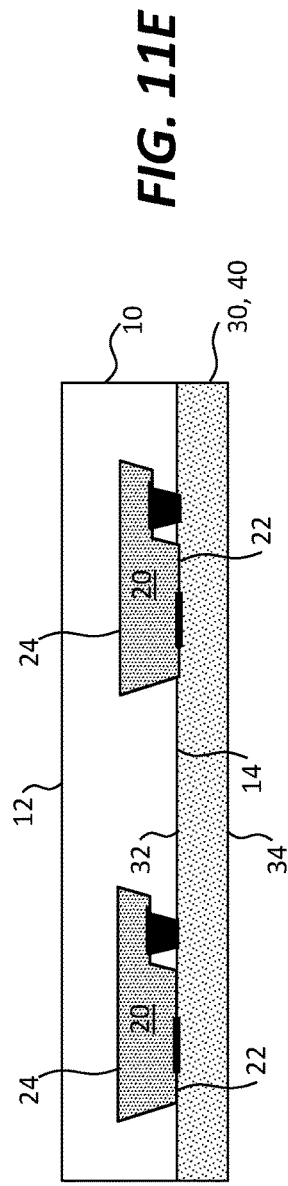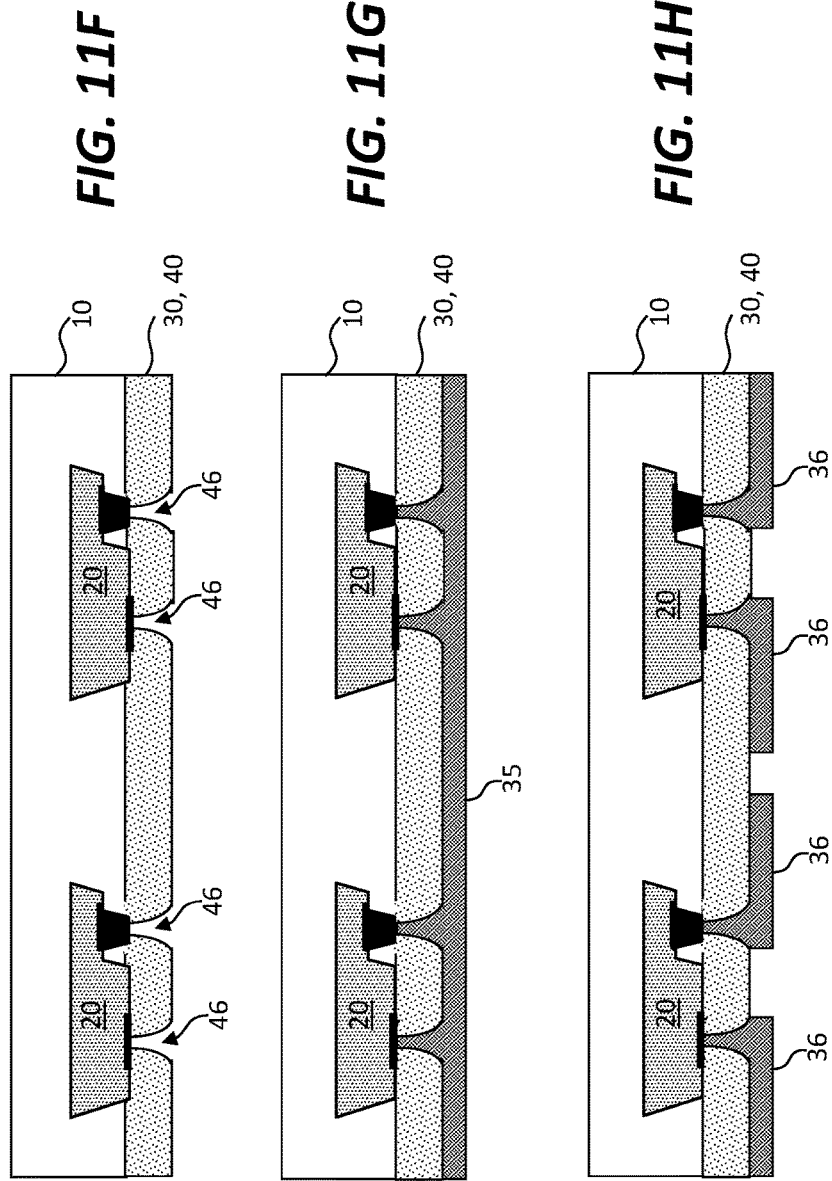

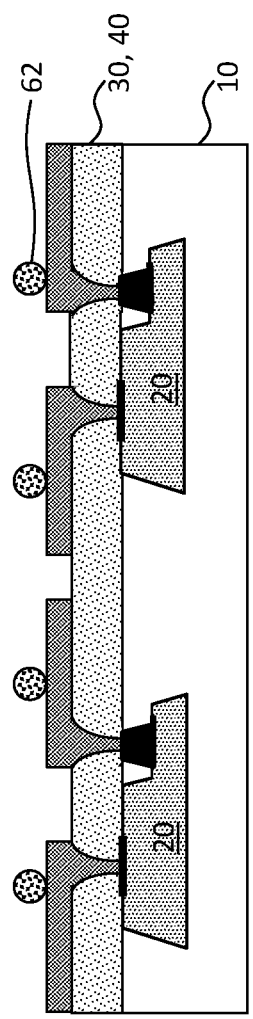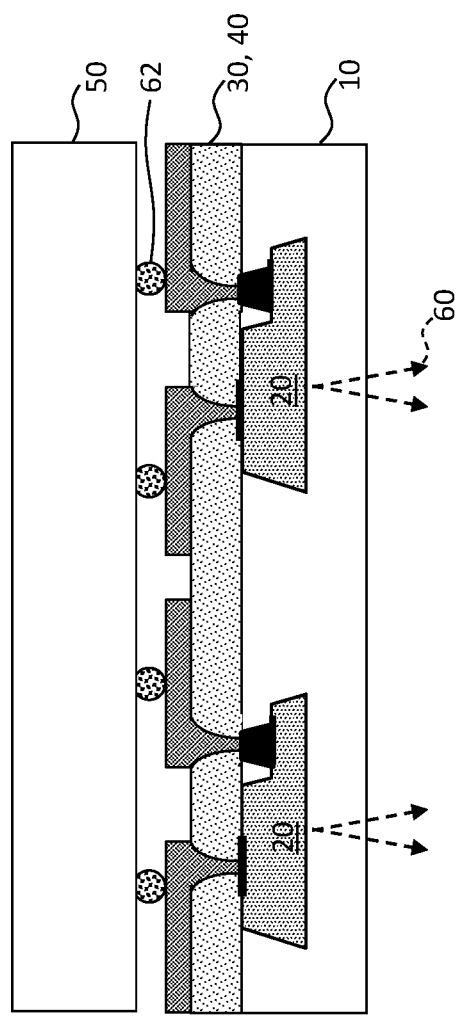

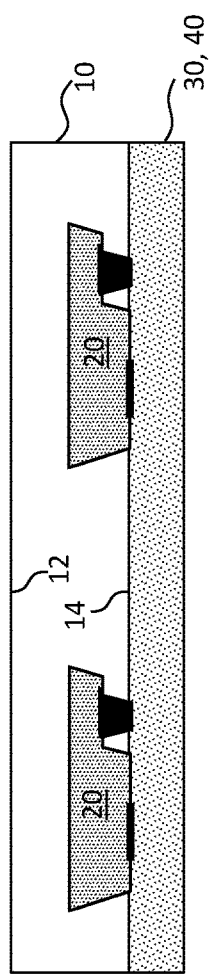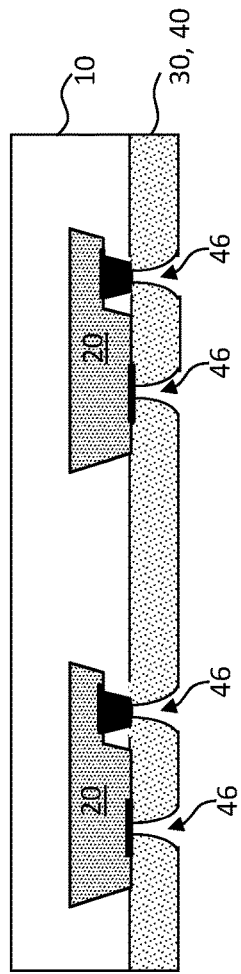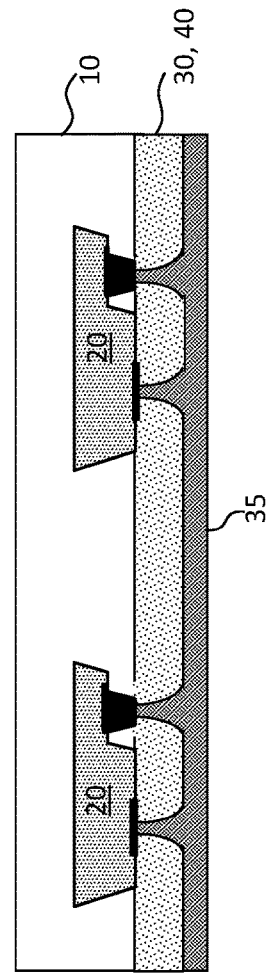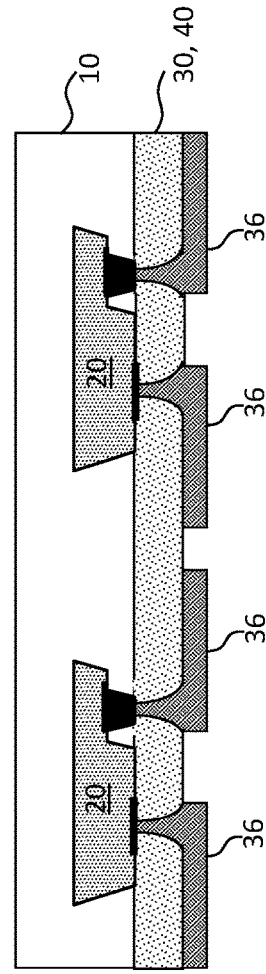

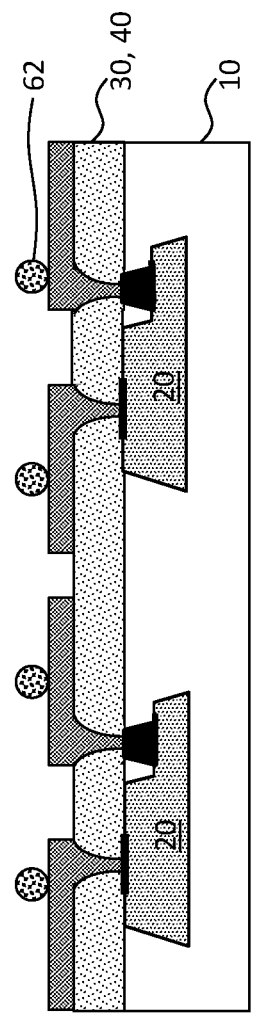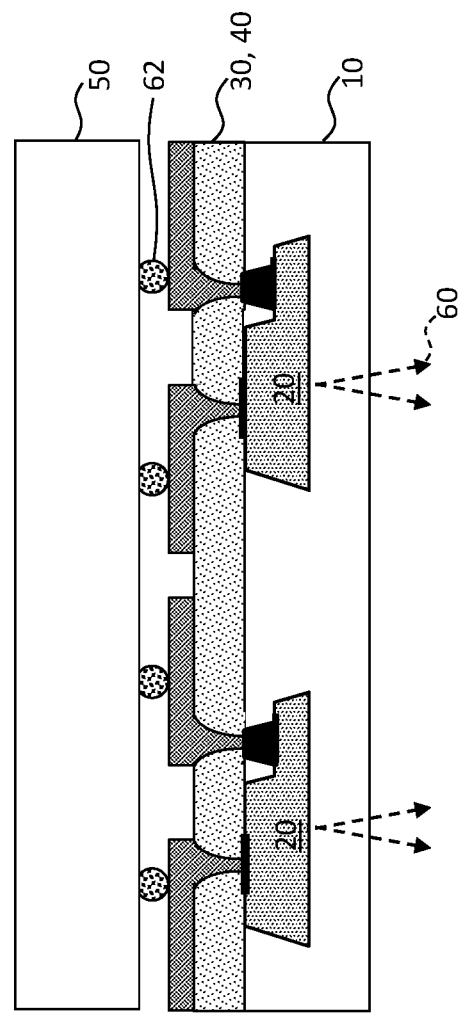

DISPLAYS WITH EMBEDDED LIGHT EMITTERS

PRIORITY APPLICATION

This application is a continuation of U.S. patent application Ser. No. 17/703,135, filed on Mar. 24, 2022, the disclosure of which is hereby incorporated by reference herein in its entirety.

CROSS REFERENCE TO RELATED APPLICATIONS

This application is related to U.S. Pat. No. 9,818,725, filed Aug. 4, 2015, entitled Inorganic-Light-Emitter Display with Integrated Black Matrix and U.S. patent application Ser. No. 16/669,493, filed Oct. 30, 2019, entitled Displays with Unpatterned Layers of Light-Absorbing Material, each of which is hereby incorporated by reference in its entirety.

TECHNICAL FIELD

The present disclosure relates generally to displays including embedded light emitters. In some embodiments, a display includes a black matrix for reducing ambient light reflections.

BACKGROUND

Flat-panel displays are widely used in conjunction with computing devices, in portable devices, and for entertainment devices such as televisions. Such displays typically employ a plurality of pixels distributed over a display substrate to display images, graphics, or text. For example, liquid crystal displays (LCDs) employ liquid crystals to block or transmit light from a backlight behind the liquid crystals and organic light-emitting diode (OLED) displays rely on passing current through a layer of organic material that glows in response to the electrical current.

Most flat-panel displays are either reflective or emissive. Reflective displays, such as many e-paper displays and reflective LCDs do not emit light but rather each of the display pixels reflects or absorbs ambient light to form an image. Such displays cannot be viewed in the dark but excel in bright conditions such as a sunny day outdoors. In contrast, light-emissive displays emit light and can be viewed in the dark but are often difficult to view in bright conditions.

In order to improve the display contrast of light-emissive displays, display designers typically use anti-reflection layers on the front cover of displays and light-absorbing layers internal to the display to reduce ambient light reflection. For example, OLED displays often employ circular polarizers on the cover glass and LCDs use an ambient-light-absorbing black matrix in combination with color filters used to color the white light emitted by the LCD backlights. These black-matrix structures are either in a common structure with the color filters or between the viewer and the color filter. For example, U.S. Pat. No. 6,466,281, entitled Integrated Black Matrix/Color Filter Structure for TFT-LCD, describes a light-shielding layer located above the switching transistors in the display. U.S. Patent Application Publication No. 2007/0077349, entitled Patterning OLED Device Electrodes and Optical Material, describes a black matrix integrated into an electrically insulating layer to absorb unwanted light in an RGBW configuration. Similarly, U.S. Pat. No. 7,402,951, entitled OLED Device having Improved Contrast, discloses a contrast enhancement element with a light-absorbing layer for absorbing ambient light. U.S. Pat. Nos. 6,812,637, 7,466,075, and 7,091,523 all describe the use of black-matrix structures to improve contrast. These light-absorbing elements or layers are located between a viewer and the light-emitting OLED pixels.

Outdoor inorganic LED displays for public viewing are known to have black louvers associated with individual pixels to reduce glare from the sun. However, such displays are not capable of high resolution.

Inorganic LED displays are also known to use black-matrix structures, as disclosed in U.S. Pat. No. 7,919,342, entitled Patterned Inorganic LED Device, in which a patterned conductive layer between and above the patterned light emitters can act as a black matrix to absorb light and increase the display contrast.

Black matrix structures in conventional displays locate light-absorbing elements or layers between a viewer and the light-emitting OLED pixels. U.S. Pat. No. 9,818,725 referenced above locates a black matrix in a common layer with light emitters. Although such arrangements can be relatively effective in absorbing ambient light, display structures that employ light emitters made using flip-chip methods and thin, light-weight support structures useful in portable and wearable displays can be useful. There remains a need, therefore, for improvements in display systems, structures, and methods of manufacturing that provide improved image quality and contrast, emission efficiency, and a reduced manufacturing cost in a mechanically and environmentally robust and flexible structure.

SUMMARY

The present disclosure provides, inter alia, a display with improved flexibility and contrast together with a simple construction. Displays of the present disclosure can comprise a support comprising an optically transparent polymer, the support having a support back surface and a support front surface, and an array of light emitters. Each of the light emitters in the array of light emitters (i) has an emission side and an electrode side, (ii) comprises electrode contacts wherein at least one of the electrode contacts is disposed in or on the electrode side, (iii) is embedded in the support such that the at least one of the electrode contacts is substantially coplanar with the support back surface, and (iv) is disposed to emit light from the emission side through the support front surface when provided with power through the electrode contacts. A redistribution layer has a support side and a distribution side, the support side disposed on and in contact with at least a portion of the support back surface. The redistribution layer comprises a dielectric layer and distribution contacts on the distribution side that extend through the dielectric layer. Each of the distribution contacts is electrically connected to a respective electrode contact of one of the light emitters through the dielectric layer and the distribution side is at least partially exposed.

In some embodiments, the redistribution layer comprises or forms a patterned black matrix. For example, the dielectric layer can be a black matrix, or the redistribution layer can comprise a black matrix disposed on the dielectric layer. The distribution side can be at least partially exposed.

In some embodiments, the distribution contacts can extend through the dielectric layer and thereby electrically connect to the electrode contacts and are at least partially exposed, for example to an external device or structure. The distribution contacts can have a lower resolution than the electrode contacts, the electrode contacts of the light emitters together can have a smaller pitch than a pitch of the distribution contacts, or the electrode contacts can each have an electrode area and the distribution contacts have a distribution area that is greater than the electrode area.

In some embodiments, the light emitters are inorganic light-emitting diodes. The support can be flexible or can be rigid or semi-rigid (e.g., sufficiently rigid to provide mechanical support to the light emitters). The support and the dielectric layer can be flexible. Any one or combination of an integrated circuit such as a controller, a cable, and a cable connector can be electrically connected to one or more of the distribution contacts and disposed at least partially on the distribution side.

The support (e.g., the optically transparent polymer) can be or comprise an optically transparent mold compound or cured optically transparent adhesive. The support can be or comprise a polymer, a resin, or an epoxy. The support can be a cured material that is deposited in liquid form and then cured, for example by heat or radiation.

The redistribution layer can likewise be or comprise a mold compound or cured adhesive. The redistribution layer can be or comprise a polymer, a resin, or an epoxy. The redistribution layer can be a cured material that is deposited in liquid form and then cured, for example by heat or radiation. The redistribution layer can be a black matrix or comprise a black matrix, for example a patterned black matrix and can be disposed in layers, one or more of which can be a black matrix. The display can comprise a patterned black matrix disposed on the distribution side of the redistribution layer so that the redistribution layer is disposed at least partially between the patterned black matrix and the support. The redistribution layer can comprise vias extending through the dielectric layer from the distribution side to the support side and each of the distribution contacts can extend through a via to make an electrical connection to an electrode contact of the light emitters. The distribution contacts can extend into the vias thereby electrically connecting to the electrode contacts of the light emitters.

In some embodiments, a display comprises a support having a support back surface and a support front surface opposite the support back surface (e.g., on an opposite side of the support), an array of light emitters disposed on the support front surface or embedded in the support, each of the light emitters is disposed to emit light away from the support back surface, and a black matrix disposed on a side of the support back surface opposite the support front surface. The black matrix can be patterned. The array of light emitters can be disposed on the support front surface or be embedded in the support material. In some embodiments, each of the light emitters in the array of light emitters (i) has an emission side and an electrode side, (ii) comprises electrode contacts wherein at least one of the electrode contacts is disposed on the electrode side, and (iii) is embedded in the support such that the at least one of the electrode contacts is substantially coplanar with the support back surface, and (iv) is disposed to emit light from or through the emission side when provided with power to the electrode contacts.

In some embodiments, a display comprises a redistribution layer having a support side and a distribution side, the support side disposed on and in contact with at least a portion of the support back surface, the redistribution layer comprising a dielectric layer and distribution contacts on the distribution side that extend through the dielectric layer, and each of the distribution contacts is electrically connected to a respective electrode contact of one of the light emitters through the dielectric layer and the distribution side is at least partially exposed. In some embodiments, the display comprises electrical devices, for example any combination of an integrated circuit, a controller, a cable, and a cable connector electrically connected to one or combination of the distribution contacts and disposed at least partially on the distribution side. The redistribution layer can comprise the patterned black matrix. In some embodiments, the redistribution layer is at least partially between the black matrix and the support back surface. The black matrix can be patterned to provide access to the distribution contacts.

In some embodiments of the present disclosure, a method of making a display comprises providing a carrier substrate, providing an array of light emitters, wherein each of the light emitters in the array of light emitters (i) has an emission side and an electrode side, (ii) comprises electrode contacts wherein at least one of the electrode contacts is disposed on the electrode side, (iii) is disposed to emit light from or through the emission side when provided with power through the electrode contacts, disposing the array of light emitters on the carrier substrate so that the electrode side of each of the light emitters in the array of light emitters is adjacent to the carrier substrate, disposing a layer of optically transparent polymer (e.g., optically clear mold compound) over the array of light emitters, the optically transparent polymer forming a support having a support back surface and a support front surface, wherein the support back surface is substantially co-planar with the electrode side, removing the carrier substrate, and providing a redistribution layer having a support side and a distribution side, the support side disposed on and in contact with at least a portion of the support back surface, the redistribution layer comprising a dielectric layer and distribution contacts extending through the dielectric layer. The distribution contacts are electrically connected to the electrode contacts of each of the light emitters and the distribution side is at least partially exposed. Some methods of the present disclosure comprise patterning a black matrix on the distribution side, for example to provide access to the distribution contacts.

According to some embodiments of the present disclosure, a display comprises a redistribution layer comprising a dielectric layer, the redistribution layer having a distribution side and a support side and distribution contacts disposed at least partially on the distribution side. An array of light emitters is disposed on the support side. Each of the light emitters in the array of light emitters (i) has an emission side and an electrode side, (ii) comprises electrode contacts with at least one of the electrode contacts disposed in or on the electrode side and the electrode contacts are electrically connected to the distribution contacts through the dielectric layer, (iii) is disposed such that the electrode side is in contact with the support side, and (iv) is disposed to emit light away from the redistribution layer when provided with power through the electrode contacts.

In some embodiments, the redistribution layer is a black matrix or comprises a black matrix or the black matrix is the dielectric layer. In some embodiments, a black matrix is disposed on the distribution side of the redistribution layer and can be patterned, for example to provide access to the distribution contacts.

According to embodiments of the present disclosure, a pitch of the distribution contacts is greater than a pitch of the electrode contacts or an area of the distribution contacts is greater than an area of the electrode contacts.

According to some methods of the present disclosure, an optically transparent polymer is disposed on the support side of the redistribution layer so that the light emitters are embedded in the optically transparent polymer.

According to some embodiments of the present disclosure, a method of making a display comprises providing a carrier substrate, disposing a redistribution layer comprising a dielectric layer on the carrier substrate, the redistribution layer having a support side and a distribution side in contact with the carrier substrate, providing an array of light emitters, wherein each of the light emitters in the array of light emitters (i) has an emission side and an electrode side, (ii) comprises electrode contacts wherein at least one of the electrode contacts is disposed on the electrode side, and (iii) is disposed to emit light from or through the emission side when provided with power through the electrode contacts, disposing the array of light emitters on the redistribution layer so that the electrode side of each of the light emitters in the array of light emitters is adjacent to the support side, removing the carrier substrate, and forming distribution contacts on the distribution side that extend through the dielectric layer and are in electrical contact with the electrode contacts. Methods described herein can comprise disposing a layer of optically transparent polymer (e.g., optically clear mold compound) over the array of light emitters and at least partly in contact with the support side.

In some embodiments, methods comprise electrically connecting an electrical device to the distribution contacts. The electrical device can be disposed on, over, or in direct contact with the distribution side. Some embodiments comprise disposing a black matrix over the distribution side.

According to some embodiments of the present disclosure, a method of making a display comprises providing a carrier substrate, disposing a redistribution layer comprising a dielectric layer on the carrier substrate, the redistribution layer having a support side and a distribution side in contact with the carrier substrate, forming distribution contacts on the distribution side that extend through the dielectric layer, providing an array of light emitters, wherein each of the light emitters in the array of light emitters (i) has an emission side and an electrode side, (ii) comprises electrode contacts wherein at least one of the electrode contacts is disposed on the electrode side, and (iii) is disposed to emit light through the emission side when provided with power through the electrode contacts, disposing the array of light emitters on the redistribution layer so that the electrode side of each of the light emitters in the array of light emitters is adjacent to the support side and the electrode contacts are in electrical contact with the distribution contacts through the dielectric layer, and removing the carrier substrate.

Some methods of the present disclosure comprise disposing a layer of optically transparent polymer (e.g., optically clear mold compound) over the array of light emitters and at least partly in contact with the support side. Some embodiments comprise electrically connecting an electrical device to the distribution contacts. Some embodiments comprise disposing the electrical device on or over the distribution side. Some embodiments comprise disposing a black matrix over the distribution side.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2-6 are cross sections illustrating embodiments of the present disclosure;

FIG. 7 is a cross section showing electrical contacts, connections, and a controller illustrating embodiments of the present disclosure;

FIGS. 11A-11J are successive cross sections illustrating construction steps according to methods of the present disclosure;

FIGS. 13A-13J are successive cross sections illustrating construction steps according to methods of the present disclosure;

Figure 1:
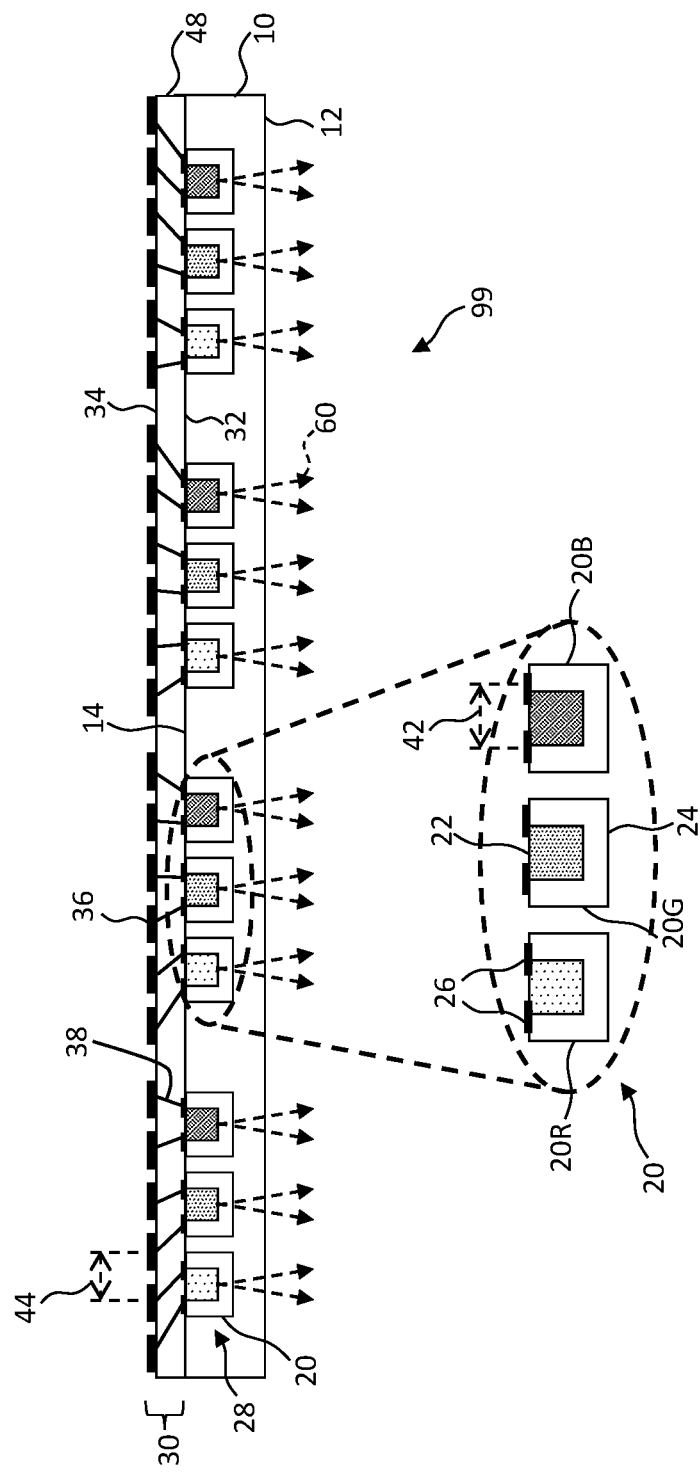
FIG. 1 is a cross section and detail illustrating embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide, among other things, displays or display tiles having improved manufacturability, contrast, and flexibility. In some embodiments, an array of light emitters is embedded in a support (e.g., an optically transparent polymer support) with electrical connections to the light emitters provided at a relatively higher resolution connected to electrical connections provided in a redistribution layer (e.g., comprising a black matrix) disposed on the support at a relatively lower resolution. A local controller disposed on the redistribution layer and electrically connected through the redistribution layer to the light emitters can enable locally controlled light emitters and flexible tiles constructed with a simple and inexpensive method.

Referring to the cross section and detail of FIG. 1 and the cross sections of FIGS. 2-6, a display 99 comprises a support 10 comprising an optically transparent polymer. Support 10 has a support back surface 14 and a support front surface 12. Each light emitter 20 in an array 28 of light emitters 20 has an emission side 24 and an electrode side 22 and comprises electrode contacts 26. At least one electrode contact 26 is disposed in or on electrode side 22 of light emitter 20 so that light emitters 20 emit light 60 through emission side 24 when electrical power is provided to electrode contacts 26. Light emitters 20 are embedded in support 10 so that at least one electrode contact 26 is substantially coplanar with support back surface 14 and light emitter 20 emits light 60 through support front surface 12. Display 99 can therefore be viewed through support front surface 12 of support 10 by an observer. By substantially coplanar is meant that at least a portion of support back surface 14 is coplanar with at least a portion of electrode contacts 26 or electrode side 22 or support 10 does not extend over electrode contacts 26 so that, with respect to support 10, electrode contacts 26 are exposed and light emitters 20 are embedded in support 10. As intended herein, if electrode contacts 26 are disposed on or protrude from electrode side 22 or electrode contacts 26 are indented in electrode side 22 but are exposed or otherwise accessible to other structures, they can still be "substantially coplanar" with support back surface 14.

A redistribution layer 30 has a support side 32 and a distribution side 34. Support side 32 of redistribution layer 30 is disposed on and in contact with at least a portion of support back surface 14. Thus, electrode contacts 26 or electrode side 22 can also be substantially coplanar with support side 32 of redistribution layer 30. Redistribution layer 30 can comprise a dielectric layer 48 and distribution contacts 36 on or in distribution side 34 that extend through dielectric layer 48. Dielectric layer 48 can be flexible, rigid, or semi-rigid. Each of distribution contacts 36 is electrically connected to an electrode contact 26, and can, for example, comprise electrically conductive wires 38, for example made of metal plugs formed in vias 46 (shown in FIG. 7 discussed below), or patterned electrically conductive metal traces disposed on or in redistribution layer 30 or support 10. Distribution side 34 is at least partially exposed, for example one or more of distribution contacts 36 is exposed. By exposed is meant that other structures contact or could contact distribution side 34 or distribution contacts 36, or both. Distribution contacts 36 can comprise wires 38 that extend through redistribution layer 30 or distribution contact 36 can be a unitary structure formed to extend through redistribution layer 30. The enlargement of FIG. 2 corresponds to FIG. 1.

The structures illustrated in FIGS. 1-7, for example can be relatively thin, for example less than 250 microns thick. Furthermore, the structure enables display tiles 99 with no significant bezel for a tiled display.

Support 10 can be a cured polymer, for example cured by heat or by ultra-violet radiation. Support 10 can be transparent, for example at least 50% (e.g., at least 60%, at least 70%, at least 80%, at least 90%, or at least 95%) transparent to visible light or light emitted by light emitters 20, or both. Support 10 can be or comprise an optically transparent polymer (e.g., an optically transparent mold compound, an optically transparent adhesive, or an optically clear adhesive) that can be, for example, a cured optically transparent polymer formed by curing one or more liquid precursors (e.g., after coating the precursors over a substrate). Support 10 can be flexible or can be rigid or semi-rigid (e.g., sufficiently rigid to provide mechanical support to light emitters 20). Light emitters 20 can be adhered to as well as embedded in support 10 (e.g., when support 10 comprises an optically clear mold compound, optically transparent adhesive, or optically clear adhesive). Similarly, redistribution layer 30 can be or comprise a polymer. In some embodiments, redistribution layer 30 is or comprises an inorganic material such as a silicon oxide or nitride. Redistribution layer 30 can be patterned, for example using photolithographic methods and materials, such as a photoresist (e.g., to form vias 46 as discussed further subsequently).

Array 28 of light emitters 20 can comprise light emitters 20 that emit different colors of light (e.g., arranged in pixels). For example, array 28 of light emitters 20 can comprise red light emitters 20R that emit red light, green light emitters 20G that emit green light, and blue light emitters 20B that emit blue light. Red, green, and blue light emitters 20R, 20G, 20B are referred to herein both collectively and individually as light emitters 20. Light emitters 20 can be, for example, inorganic light emitters such as light-emitting diodes, for example micro-LEDs. In some embodiments, micro-LEDs are micro-transfer printed and can comprise separated or broken (e.g., fractured) tethers 21 (see FIG. 7 discussed below). Light emitters 20 can be non-native to support 10, redistribution layer 30, or both. Light emitters 20 can be horizontal light emitters 20 or vertical light emitters 20. Light emitters 20 can be made in an integrated circuit process using compound semiconductors such as, for example, GaN or GaAs. Each set of red, green, and blue light emitters 20R, 20G, 20B can form a pixel in display 99. Array 28 of light emitters 20 can comprise an array of pixels. Pixels can additionally include light emitters 20 that emit light of a color other than red, green, or blue, such as, for example, yellow. Adjacent pixels can be spaced apart farther than any pair of light emitters 20 within a pixel. For a discussion of micro-transfer printing techniques that can be used to print non-native light emitters 20 to form displays 99 disclosed herein see, U.S. Pat. Nos. 8,722,458, 7,622,367 and 8,506,867, each of which is hereby incorporated by reference.

Electrode contacts 26 can be formed and patterned on a light emitter 20 in or on a compound semiconductor, for example by evaporative deposition and photoresist patterning of a metal such as aluminum. Electrode contacts 26 can be a designated portion of a semiconductor, such as a doped compound semiconductor, to which an electrical connection is made (e.g., with a distribution contact 36). Similarly, distribution contacts 36 can be formed and patterned on dielectric layer 48 and support back surface 14 of support 10, for example by evaporative deposition and photoresist patterning of a metal, such as aluminum.

According to some embodiments of the present disclosure, distribution contacts 36 can have or be formed at a relatively lower resolution compared to electrode contacts 26 formed at a relatively greater resolution. For example, electrode contacts 26 can be made using photolithographic processes in an integrated circuit fabrication facility and distribution contacts 36 can be made using printed circuit board methods. "Resolution" is meant as the smallest structure dimension or structure separation on a substrate surface or the pitch between centers of repeated structures on the substrate surface in a dimension substantially parallel to the substrate surface. In some embodiments, an electrode contact pitch 42 of electrode contacts 26 (the smallest separation between the centers of two neighboring electrode contacts 26 in a dimension either within a single light emitter 20, as shown in the FIG. 1 detail, or between two separate neighboring light emitters 20) is smaller than a distribution pad pitch 44 of distribution contacts 36 (the smallest separation between the centers of two neighboring distribution contacts 36 in a dimension), as shown in FIG. 1. Neighboring contacts are two contacts between which there is no other contact. One or more electrode contacts 26 can have an area substantially parallel to substrate back surface 14 (or support side 32) that is smaller than an area of one or more distribution contacts 36 substantially parallel to distribution surface 34. Thus, electrode contacts 26 can have an electrode area and distribution contacts 36 can have a distribution area that is greater than the electrode area.

Figure 3:
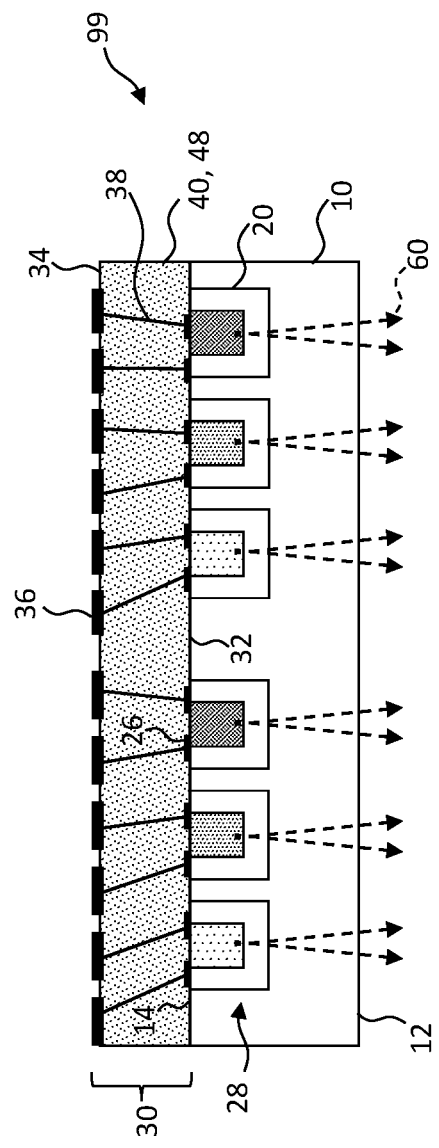

As shown in FIG. 3, redistribution layer 30 can be or incorporate a light-absorbing dielectric material, for example redistribution layer 30 can be or comprise a black matrix 40 that is also a dielectric material 48. Such a black matrix 40 absorbs visible light and improves the contrast of display 99 when observed by a viewer in an environment with ambient light. Black-matrix 40 can include a polymer, resin, acrylic, or curable resin, for example with cross-linking materials and can include light-absorbing particles, pigments, or dyes, for example carbon black, or black metal particles such as chromium dioxide or other metal oxides.

As shown in FIG. 4, redistribution layer 30 can comprise multiple layers including a layer of black matrix 40 and a dielectric layer 48. Layer of black matrix 40 can also be a dielectric layer 48. The layer of black matrix 40 can be positioned adjacent to and in contact with support back surface 14 of support 10 (as shown in FIG. 4) or adjacent to and forming distribution side 34 of redistribution layer 30 (as shown in FIG. 5) or between dielectric layers 48 (not shown). Referring to FIG. 6, black matrix 40 can be disposed over or on redistribution layer 30 as a separate layer over or on distribution contacts 36 that is patterned to expose at least a portion of one or more distribution contacts 36. Thus, according to some embodiments, a display 99 comprises a patterned black matrix 40 disposed on distribution side 34 of redistribution layer 30 so that redistribution layer 30 is at least partially between patterned black matrix 40 and support 10.

As shown in the cross section of FIG. 7, a display 99 according to some embodiments of the present disclosure comprises a support 10 in which is embedded light emitters 20, for example horizontal inorganic light-emitting diodes having electrode contacts 26 on a common side of light emitters 20 and substantially flush with or slightly protruding from support back surface 14. Horizontal inorganic light-emitting diodes can be disposed by micro-transfer printing and can comprise separated or broken (e.g., fractured) tethers 21 resulting from the particular micro-transfer printing method that is used. Horizontal light emitters 20 have at least two electrode contacts 26 disposed on a common side of the light emitter 20 (e.g., as shown in FIG. 7). Light emitters 20 can be vertical light-emitting diodes with electrode contacts 26 on opposing sides of light emitter 20.

Redistribution layer 30 (which can be or incorporate a black matrix 40) is disposed on support back surface 14. In some embodiments, redistribution layer 30 is formed at least in part by coating a liquid (e.g., using spin, curtain hopper, or slot coating) and then curing the liquid, for example by heat or radiation. In some embodiments, the cured layer is then further processed, for example by photolithographic patterning or etching. In some embodiments, vias 46 formed in redistribution layer 30 enable distribution contacts 36 to contact electrode contacts 26 and provide electrical access to light emitters 20 from distribution side 34 of redistribution layer 30. Vias 46 can be formed in redistribution layer 30 using photolithographic methods. Distribution contacts 36 can extend through dielectric layer 48 and are exposed on distribution side 34 of redistribution layer 30. The portion of distribution contact 36 that extends through dielectric layer 48 can be considered a wire 38 (e.g., as labelled in FIG. 7). Thus, in some embodiments of the present disclosure, redistribution layer 30 comprises vias 46 and each distribution contact 36 extends through a via 46 to make an electrical connection to an electrode contact 26. In some embodiments, electrical conductors separate from distribution contacts 36 are disposed in vias 46 (e.g., in a multi-step process) (e.g., having a different composition). In some embodiments, a distinct wire is disposed to extend through redistribution layer 30 to electrically connect distinct distribution contacts 36 and electrode contacts 26. In some embodiments, electrode contacts 26 protrude through redistribution layer 30 to form electrical connections to distribution contacts 36 (e.g., where redistribution layer 30 is coated and cured over support 10 and light emitters 20 at a thickness where electrode contacts 26 protrude therefrom).

In some embodiments, electrical structures or electrical devices 50 can be disposed over distribution side 34 of redistribution layer 30 to electrically connect to distribution contacts 36. For example, an electrical device 50 such as an integrated circuit, a controller, a cable, or a cable connector is electrically connected to one or more of distribution contacts 36 and disposed at least partially on distribution side 34. Electrical connections 62 (e.g., solder balls 62) can be disposed on distribution contacts 36 to electrically connect electrical devices 50 to light emitters 20 through electrode contacts 26 and distribution contacts 36. Distribution pad pitch 44 (e.g., a pitch of solder balls 62) is larger than electrode contact pitch 42. Electrical devices 50 can control, or provide an electrical connection to control, light emitters 20.

Conventional emissive displays, for example liquid crystal displays and OLED displays, dispose a black matrix between the viewer and a light emitting device (for example, a backlight or organic light-emitting diodes). In contrast, certain embodiments of the present disclosure enable a flexible display with a black matrix 40 disposed behind light emitters 20. Such an arrangement enables a thinner, more flexible device with reduced connection resolution. In some embodiments, when light emitters 20 are micro-transfer printed micro-light-emitting diodes (micro-LEDs) embedded in support 10, the emissive area of light emitters 20 is relatively small (for example no more than 10%, 5%, 1%, 0.1%, or 0.01%) compared to the display area of the display, where the display area is the convex hull of light emitters 20 on support back surface 14. Thus, black matrix 40 can effectively improve display 99 contrast ratio, especially since electrode contacts 26 and wires 38 are substantially occluded by light emitters 20 and distribution contacts 36 can be behind black matrix 40 with respect to an observer and the direction of light 60 emission.

Figure 8:
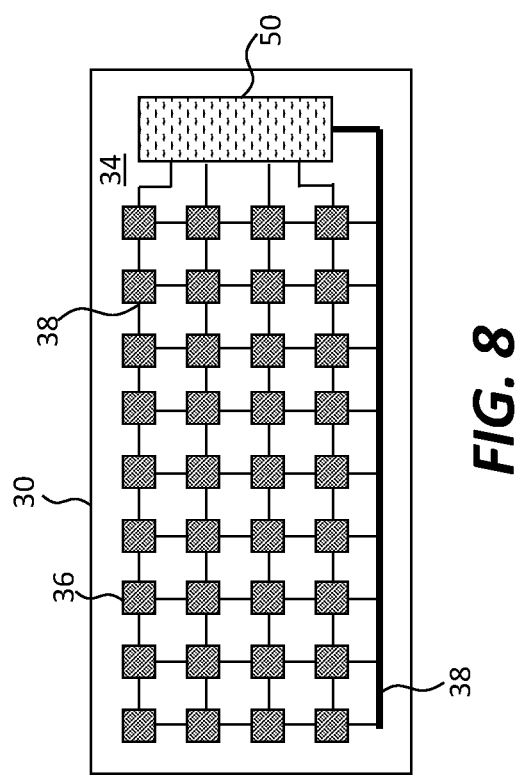
FIG. 8 is an electrical schematic illustrating electrical connections useful in understanding embodiments of the present disclosure.
Figure 9:
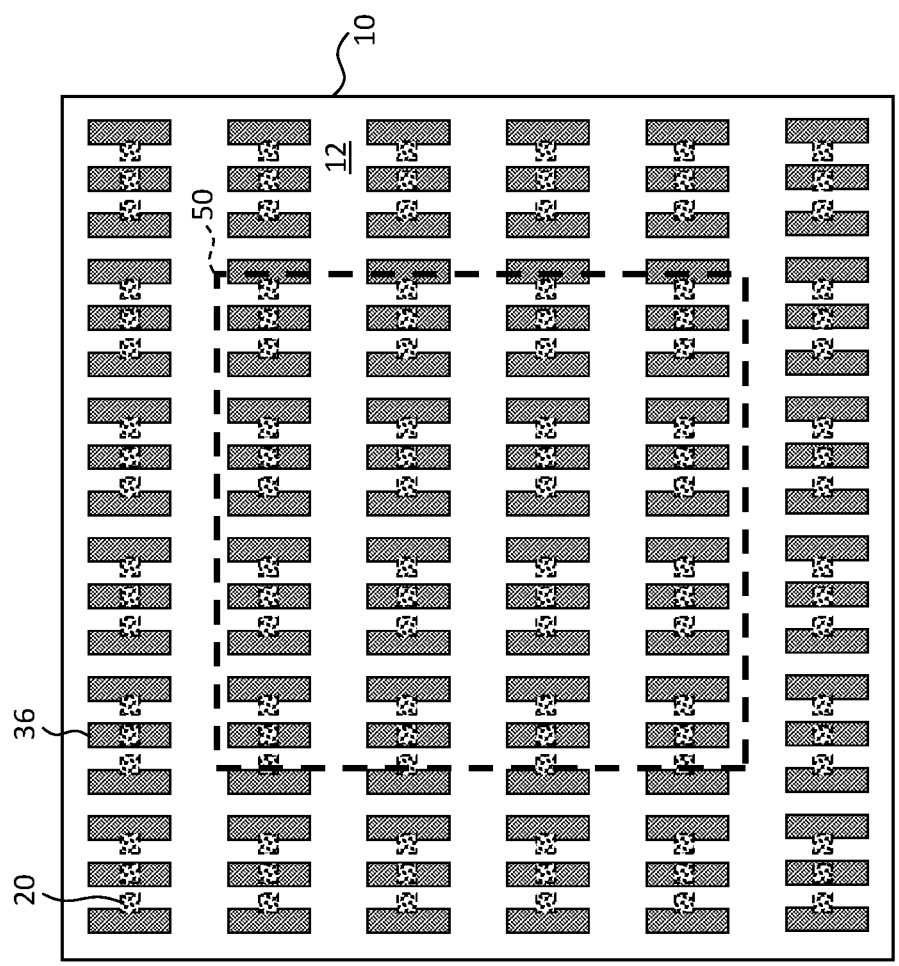
FIG. 9 is a schematic bottom view illustrating structures useful in understanding embodiments of the present disclosure.

FIG. 8 is a simplified electrical schematic of a display 99 illustrating distribution contacts 36 on distribution side 34 electrically connected to an electrical device 50 through matrix-addressing row and column wires 38 (thicker wires 38 represent buses). FIG. 9 is a bottom view of support front surface 12 of support 10 illustrating light emitters 20 embedded in support 10, distribution contacts 36, and electrical device 50 on a side of support 10 opposite support front surface 12.

Figure 10:
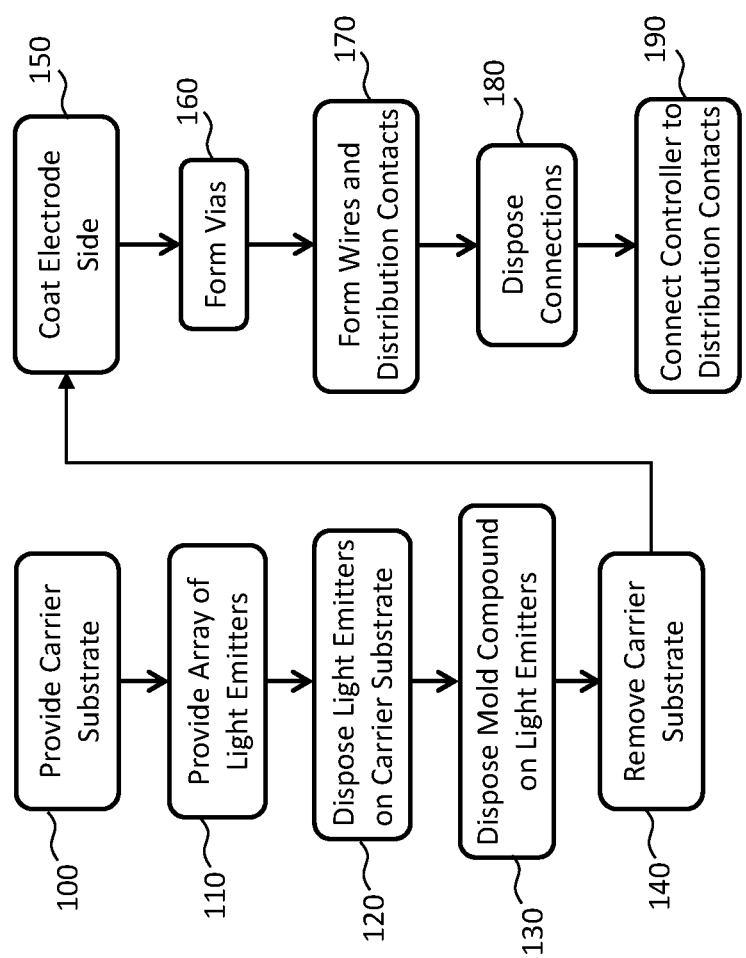
FIG. 10 is a flow diagram illustrating embodiments of the present disclosure.

The flow diagram of FIG. 10 and successive cross sections of FIGS. 11A-11J illustrate methods of the present disclosure. Referring first to FIG. 11A a carrier substrate 70 is provided in step 100 and an array 28 of light emitters 20 is provided in step 110, for example on a source substrate. Each light emitter 20 on a source substrate can be disposed over a sacrificial portion of a source substrate and physically connected to the source substrate by a tether 21 attached to an anchor (e.g., one or more tethers 21 to each of one or more respective anchors). Carrier substrate 70 can be, for example, a glass or semiconductor wafer or substrate and can comprise an adhesive layer (not shown). Light emitters 20 are disposed on carrier substrate 70 in step 120 so that electrode contacts 26 are adjacent to carrier substrate 70, as shown in FIG. 11B, for example by micro-transfer printing light emitters 20 from a source substrate to carrier substrate 70. Light emitters 20 have an electrode side 22 with electrode contacts 26 and an emission side 24 through which light 60 is emitted when power is provided to electrode contacts 26. Electrode side 22 is disposed in contact with, or adjacent to, carrier substrate 70. In step 130, and as shown in FIG. 11C, mold compound 10 is coated over light emitters 20 and carrier substrate 70, for example as a liquid by spray, spin, curtain hopper, or other coating means and then cured, for example by heat or radiation, such as ultra-violet radiation. Mold compound 10 can be provided as a liquid and then cured after coating to form a support 10 with a support front surface 12 and a support back surface 14. An optional temporary support, such as a glass stiffener, can be adhered, for example with a temporary adhesive, to mold compound 10 to provide additional mechanical strength and support for the following construction steps and removed at the end of the process, for example if necessary or desired (not shown).

Figure 2:
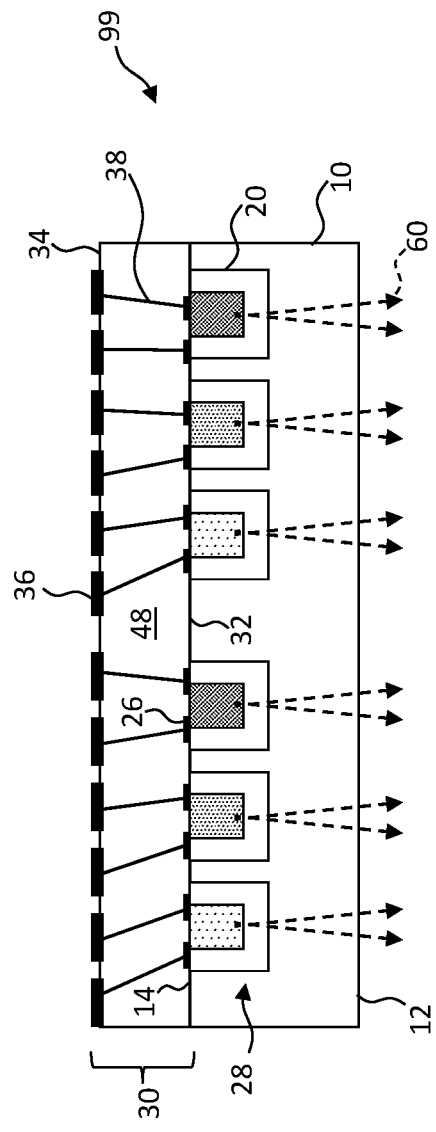

As shown in FIG. 11D, in step 140 carrier substrate 70 is removed, for example by lift-off, etching, peeling, polishing, or grinding. In some embodiments, carrier substrate 70 comprises an ablation layer and removal is accomplished by laser ablation. Referring to FIG. 11E, in step 150 electrode side 22 is coated to form a redistribution layer 30 having a support side 32 and a distribution side 34, for example by spray, spin, hopper, or other coating means, on support back surface 14 so that support back surface 14 is substantially co-planar with electrode side 22 of light emitter 20. Redistribution layer 30 can be or comprise a black matrix 40, for example as shown in FIGS. 3 and 11E, or can be a multi-layer structure formed in multiple coating steps and incorporating a dielectric layer 48 and black matrix 40, as shown in FIGS. 4 and 5. Thus, in some embodiments, a black matrix 40 is disposed over support back surface 14 and a dielectric layer 48 is disposed over black matrix 40, to form redistribution layer 30. In some embodiments, a dielectric layer 48 is disposed over support back surface 14 and a black matrix 40 is disposed over dielectric layer 48, to form redistribution layer 30. In some embodiments, redistribution layer 30 is substantially transparent, for example as shown in FIGS. 1 and 2.

In step 160 and as shown in FIG. 11F, vias 46 are formed extending through redistribution layer 30, for example using photoresist and photolithography. As shown in FIG. 11G, vias 46 are filled with a distribution conductor 35, for example an electrically conductive material, for example, a metal such as aluminum, cured conductive inks, or transparent conductive oxides deposited by evaporation, sputtering, ink jetting, or coating, and electrically connected to electrode contacts 26 and patterned, in step 170 and as shown in FIG. 11H, for example with photoresist using photolithographic processes to form distribution contacts 36 that are at least partially exposed. Portions of redistribution layer 30 can be at least partially exposed.

In some embodiments, electrical connections 62, such as solder balls 62, are deposited on distribution contacts 36 in step 180 and as shown (inverted) in FIG. 11I, for example using solder bumping methods. The distribution or pitch of solder balls 62 can be at a relatively lower resolution than a relatively higher resolution or pitch of electrode contacts 26. An electrical device 50, such as a controller, ribbon cable with an anisotropic conductive film, or cable connector, can be soldered to solder balls 62, in step 190 and as shown in FIG. 11J using conventional soldering methods. Any optional temporary support that was provided (not shown) can be removed, for example by peeling or laser lift-off. Thus, relatively high-resolution electrode contacts 26 are redistributed to relatively low-resolution distribution contacts 36, solder balls 62 (e.g., any solder connection), and electrical connections 62 to electrical devices 50 such as integrated circuits, connectors, or cables. An electrical device 50 can control or provide electrical connections 62 to light emitters 20 through distribution contacts 36, any wires 38, and electrode contacts 26. According to some embodiments of the present disclosure, a black matrix 40 is patterned on distribution side 34 after disposing redistribution layer 30 and forming distribution contacts 36 (e.g., as shown in FIG. 6) to expose distribution contacts 36.

In some embodiments of the present disclosure and as shown, for example, in FIG. 3, a display 99 comprises a support 10 having a support back surface 14 and a support front surface 12. An array 28 of light emitters 20 is disposed on support front surface 12 or embedded in support 10 with electrode contacts 26 substantially coplanar with support back surface 14. Each light emitter 20 emits light 60 away from support back surface 14 and, in some embodiments, through support front surface 12. Optionally, a black matrix 40 is disposed on a side of support back surface 14 opposite support front surface 12. In some embodiments, array 28 of light emitters 20 is disposed on support front surface 12 (not shown). In some embodiments, each of light emitters 20 in array 28 of light emitters 20 (i) has an emission side 24 and an electrode side 22, (ii) comprises electrode contacts 26 wherein at least one electrode contact 26 is disposed on electrode side 22, and (iii) is embedded in support 10 so that the at least one electrode contact 26 is substantially coplanar with support back surface 14, and (iv) emits light 60 through emission side 24 when provided with power through electrode contacts 26.

In some embodiments, display 99 comprises a redistribution layer 30 having a support side 32 and a distribution side 34. Support side 32 is disposed on and in contact with at least a portion of support back surface 14. Redistribution layer 30 can comprise a dielectric layer 48. Distribution contacts 36 on distribution side 34 can extend through dielectric layer 48 (e.g., through vias 46 formed in dielectric layer 48). Each distribution contact 36 is electrically connected to an electrode contact 26 and distribution side 34 is at least partially exposed as can be distribution contacts 36. An electrical device 50, for example any one or combination of a controller, a cable, and a cable connector, is electrically connected to one or more of distribution contacts 36 and disposed at least partially on distribution side 34. In some embodiments, black matrix 40 is patterned and redistribution layer 30 comprises patterned black matrix 40. In some embodiments, redistribution layer 30 is at least partially between black matrix 40 and support back surface 14.

Figure 12:
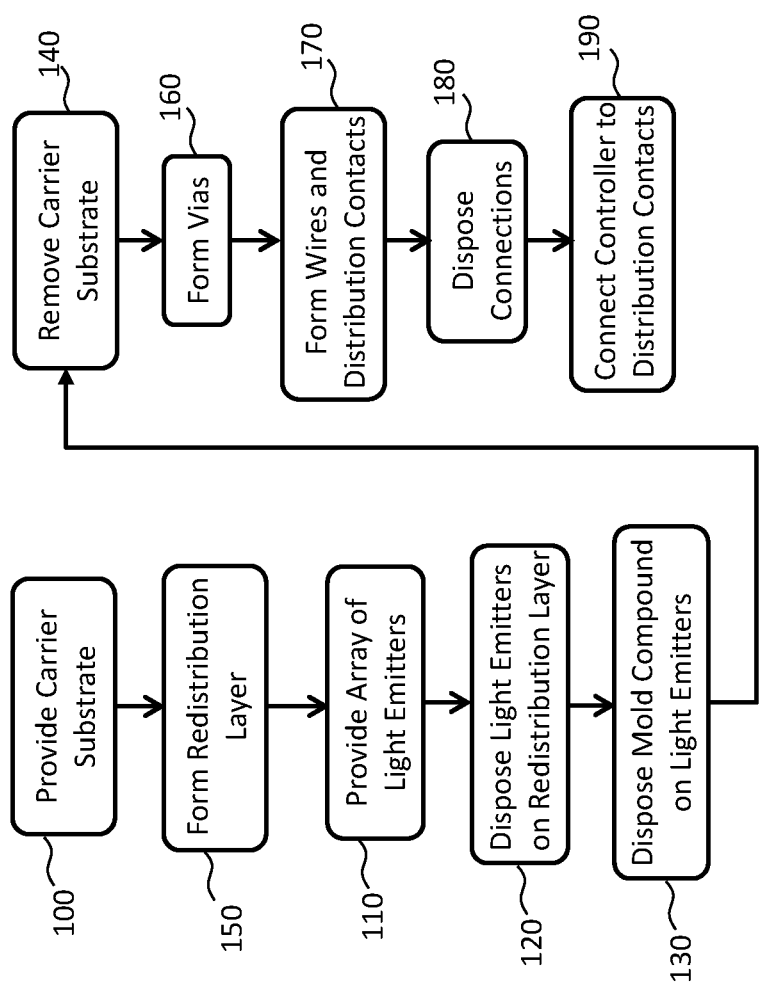
FIG. 12 is a flow diagram illustrating embodiments of the present disclosure.
Figure 13A:
Figure 13B:
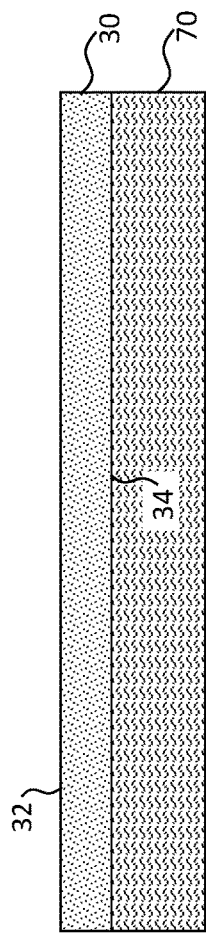
Figure 13C:
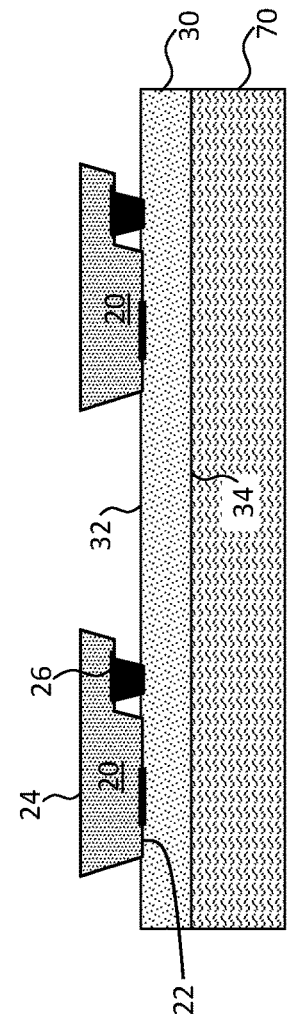
Figure 13D:
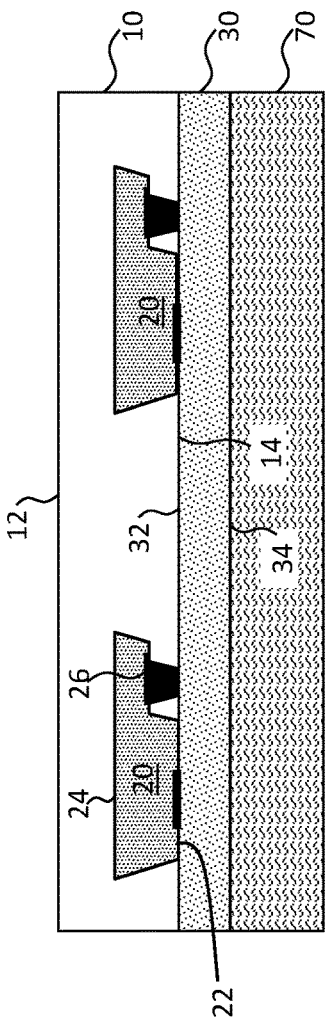

According to some embodiments of the present disclosure, and as illustrated, for example, in the flow diagram of FIG. 12 and successive structural cross sections of FIGS. 13A-13J, a method of making a display 99 comprises providing a carrier substrate 70 in step 100 as shown in FIG. 13A and disposing or forming a redistribution layer 30 comprising a dielectric layer 48 on carrier substrate 70 in step 150 as shown in FIG. 13B. Redistribution layer 30 can have a support side 32 and a distribution side 34 where the distribution side 34 is in contact with carrier substrate 70. In step 110, an array 28 of light emitters 20 is provided, for example on one or more source substrates. Each light emitter 20 on a source substrate can be disposed over a sacrificial portion of the source substrate and physically connected to the source substrate by a tether attached to an anchor (e.g., one or more tethers 21 to each of one or more respective anchors). Each light emitter 20 in array 28 of light emitters 20 (i) has an emission side 24 and an electrode side 22, (ii) comprises electrode contacts 26 wherein at least one electrode contact 26 is disposed on electrode side 22, and (iii) emits light 60 through emission side 24 when provided with power through electrode contacts 26. Array 28 of light emitters 20 is disposed in step 120 on redistribution layer 30, for example by micro-transfer printing, as shown in FIG. 13C so that electrode side 22 of each of light emitters 20 in array 28 of light emitters 20 is adjacent to support side 32. Optionally, in step 130 and as shown in FIG. 13D, mold compound 10 is coated over light emitters 20 and support side 32 of redistribution layer 30. In some embodiments, step 130 can be performed after any one of the following steps. An optional temporary support can be adhered, for example with a temporary adhesive, to mold compound 10 to provide additional mechanical strength and support for the following construction steps and removed at the end of the process, if necessary (not shown).

Carrier substrate 70 can be removed in step 140 and as shown in FIG. 13E, and distribution contacts 36 formed on distribution side 34 that extend through dielectric layer 48 and are in electrical contact with electrode contacts 26, for example by forming vias 46 in step 160 as shown in FIG. 13F and forming wires 38 and distribution contacts 36 (e.g., where wires 38 are portions of distribution contacts 36) in step 170, for example by coating a distribution conductor 35 over distribution side 34 and vias 46 as shown in FIG. 13G, and then patterning distribution conductor 35 to form distribution contacts 36, for example using photoresist and photolithographic methods, as shown in FIG. 13H.

In some embodiments, electrical connection materials, such as solder balls 62, are deposited on distribution contacts 36 in step 180 and as shown (inverted) in FIG. 13I, for example using solder bumping methods. The distribution of solder balls 62 can be at a lower resolution or pitch than a resolution or pitch of electrode contacts 26. An electrical device 50, such as a controller, ribbon cable, or cable connector, can be soldered to solder balls 62, in step 190 and as shown in FIG. 13J using conventional soldering methods. Any optional temporary support that was provided (not shown) can be removed, for example by peeling or laser lift-off. Thus, relatively high-resolution electrode contacts 26 are redistributed to relatively low-resolution distribution contacts 36, solder balls 62 (e.g., any solder connection), and electrical connections 62 to electrical devices 50 such as integrated circuits, connectors, or cables. An electrical device 50 can control or provide electrical connections 62 to light emitters 20 through distribution contacts 36, any wires 38, and electrode contacts 26. According to some embodiments of the present disclosure, a black matrix 40 is disposed and patterned on distribution side 34 after disposing redistribution layer 30 and forming distribution contacts 36 (e.g., as shown in FIG. 6). In some embodiments, a black matrix 40 is disposed over distribution side 34 for example before steps 180 and 190. Black matrix 40 can be patterned similarly to distribution conductor 35 or redistribution layer 30 (e.g., as shown in FIG. 6) to enable electrical contact to distribution contacts 36.

FIGS. 13E-13J and associated process steps can be identical to the process steps of FIGS. 11E-11J and the structures can be the same, but are not necessarily so. The process of FIG. 12 differs from the process of FIG. 10 by forming redistribution layer 30 before disposing mold compound 10. The choice of methods can be a matter of design choice.

According to some embodiments of the present disclosure, a display 99 comprises a redistribution layer 30 comprising a dielectric layer 48. Redistribution layer 30 can have a distribution side 34 and a support side 32 and distribution contacts 36 disposed at least partially on distribution side 34. An array 28 of light emitters 20 is disposed on support side 32. Each light emitter 20 in array 28 of light emitters 20 (i) has an emission side 24 and an electrode side 22, (ii) comprises electrode contacts 26 wherein at least one electrode contact 26 is disposed in or on electrode side 22 and electrode contacts 26 are electrically connected to distribution contacts 36 through dielectric layer 48, (iii) electrode side 22 is in contact with support side 32, and (iv) each light emitter 20 emits light 60 away from redistribution layer 30 when provided with power through electrode contacts 26.

In some embodiments, redistribution layer 30 comprises a black matrix 40 and a distinct dielectric layer 48 or comprises a black matrix 40, for example in layered combinations with dielectric layer 48 (e.g., as shown in FIGS. 4 and 5). As shown in FIG. 6, in some embodiments display 99 comprises a black matrix 40 disposed on distribution side 34 of redistribution layer 30. In some embodiments, a pitch of distribution contacts 36 is greater than a pitch of electrode contacts 26. In some embodiments, a pitch of electrical connections 62 (solder balls 62) is greater than a pitch of electrode contacts 26. More generally, in some embodiments electrical connections 62 made to distribution contacts 36 on distribution side 34 have a greater pitch than a pitch of electrode contacts 26. In some embodiments, an optically transparent polymer (e.g., mold compound 10 or support 10) is disposed on support side 32 of redistribution layer 30 and light emitters 20 so that light emitters 20 are embedded in the optically transparent polymer.

Figure 14:
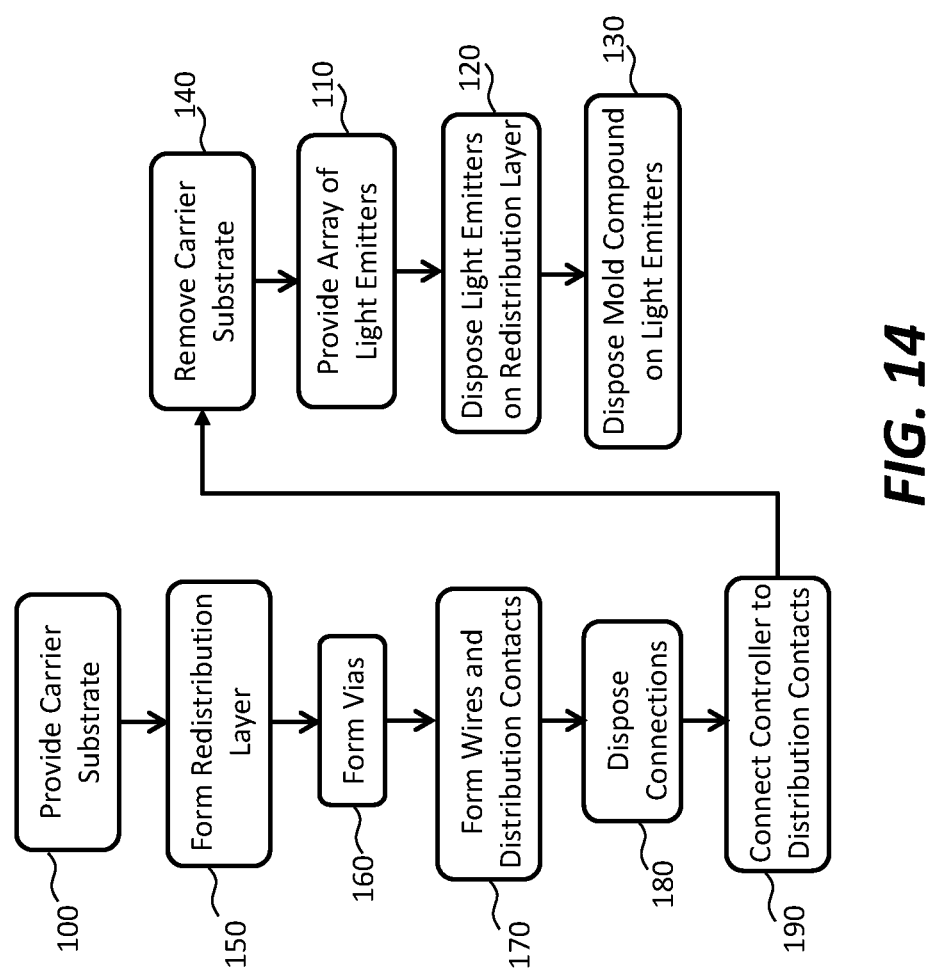
FIG. 14 is a flow diagram illustrating embodiments of the present disclosure.
Figure 15A:
FIGS. 15A-15J are successive cross sections illustrating construction steps according to methods of the present disclosure.
Figure 15B:
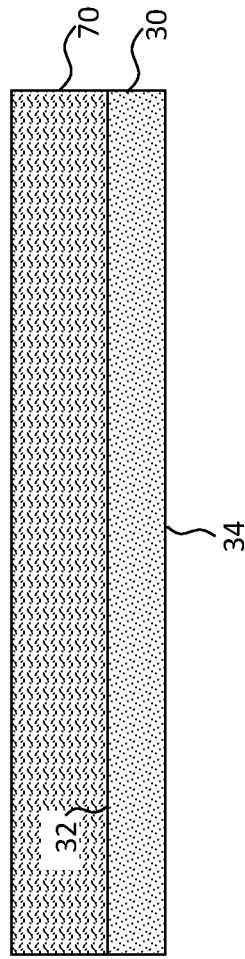

According to some embodiments of the present disclosure and as illustrated in the flow diagram of FIG. 14 and successive structural cross sections of FIGS. 15A-15J, a method of making a display 99 comprises providing a carrier substrate 70 in step 100 as shown in FIG. 15A, disposing or forming a redistribution layer 30 comprising a dielectric layer 48 on carrier substrate 70 in step 150 as shown in FIG. 15B. Redistribution layer 30 can have a support side 32 and a distribution side 34 where support side 32 is in contact with carrier substrate 70.

Figure 15C:
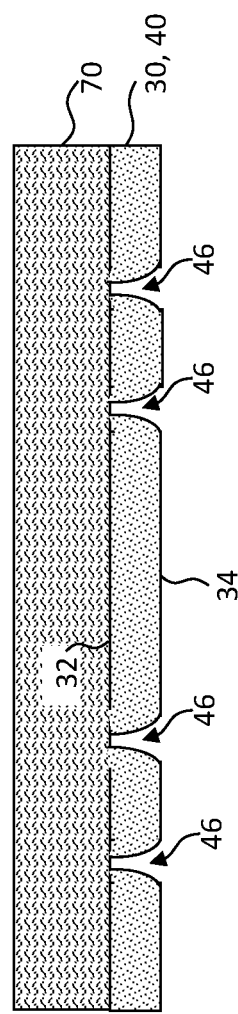
Figure 15D:
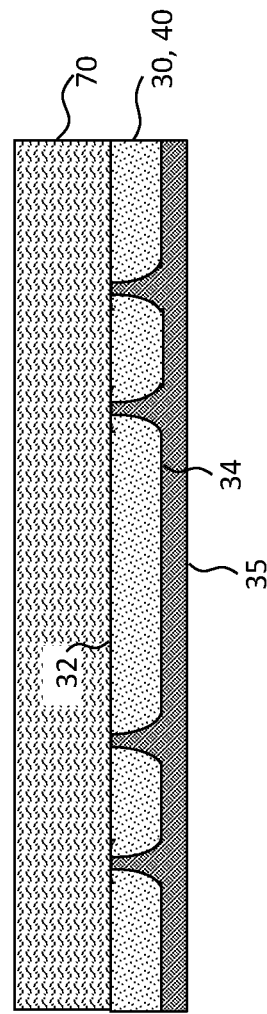
Figure 15E:
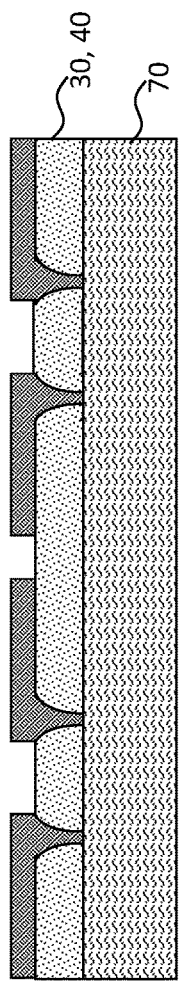

Distribution contacts 36 can be formed on distribution side 34 that extend through dielectric layer 48, for example by forming vias 46 in step 160 as shown in FIG. 15C and forming wires 38 and distribution contacts 36 in step 170, for example by coating a distribution conductor 35 over distribution side 34 and vias 46 as shown in FIG. 15D, and then patterning distribution conductor 35 to form distribution contacts 36, for example using photoresist and photolithographic methods, as shown in FIG. 15E.

Figure 15F:
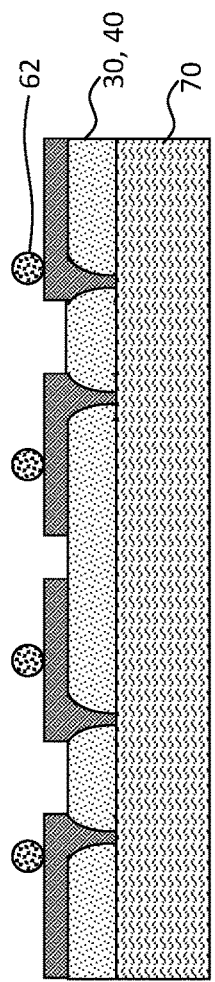
Figure 15G:
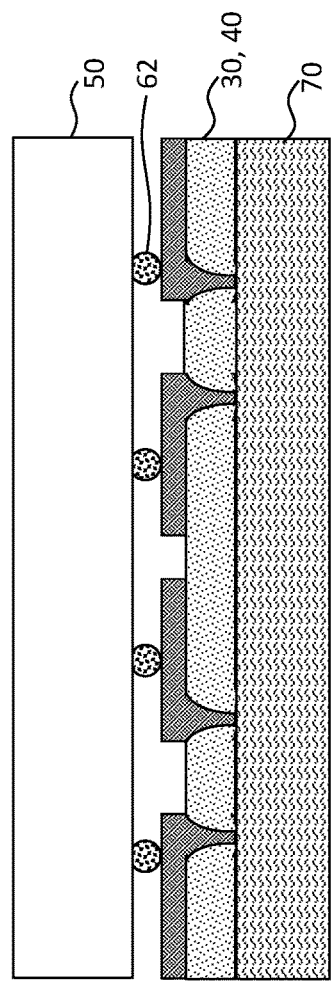

In some embodiments, electrical connection materials, such as solder balls 62, are deposited on distribution contacts 36 in step 180 and as shown (inverted) in FIG. 15F, for example using solder bumping methods. The distribution of solder balls 62 can be at a lower resolution than a resolution of electrode contacts 26. An electrical device 50, such as a controller, ribbon cable, or cable connector, can be soldered to solder balls 62, in step 190 and as shown in FIG. 15G using conventional soldering methods. Any optional temporary support that was provided (not shown) can be removed, for example by peeling or laser lift-off. Thus, relatively high-resolution electrode contacts 26 are redistributed to relatively low-resolution distribution contacts 36, solder balls 62 (e.g., any solder connection), and electrical connections 62 to electrical devices 50 such as integrated circuits, connectors, or cables. An electrical device 50 can control or provide electrical connections 62 to light emitters 20 through distribution contacts 36, any wires 38, and electrode contacts 26. A controller can provide electrical power, electrical signals, or both to control light emitters 20. According to some embodiments of the present disclosure, a black matrix 40 is patterned on distribution side 34 after disposing redistribution layer 30 (e.g., as shown in FIG. 6). In some embodiments, a black matrix 40 is disposed over distribution side 34 for example before steps 180 and 190. Black matrix 40 can be patterned similarly to distribution conductor 35 or redistribution layer 30 (e.g., as shown in FIG. 6) to enable electrical contact to distribution contacts 36. In embodiments, steps 180 and 190 can be performed after any one of the following steps.

Figure 15H:
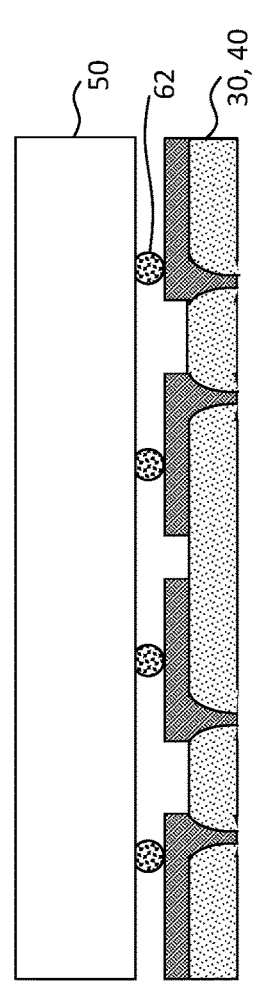

Carrier substrate 70 can be removed in step 140 and as shown in FIG. 15H. In embodiments, carrier substrate 70 can be removed after any prior step after step 150. An optional temporary support can be adhered, for example with a temporary adhesive, to support side 32 of redistribution layer 30 to provide additional mechanical strength and support for the following construction steps and removed before step 110 (described below), if necessary (not shown).

Figure 15I:
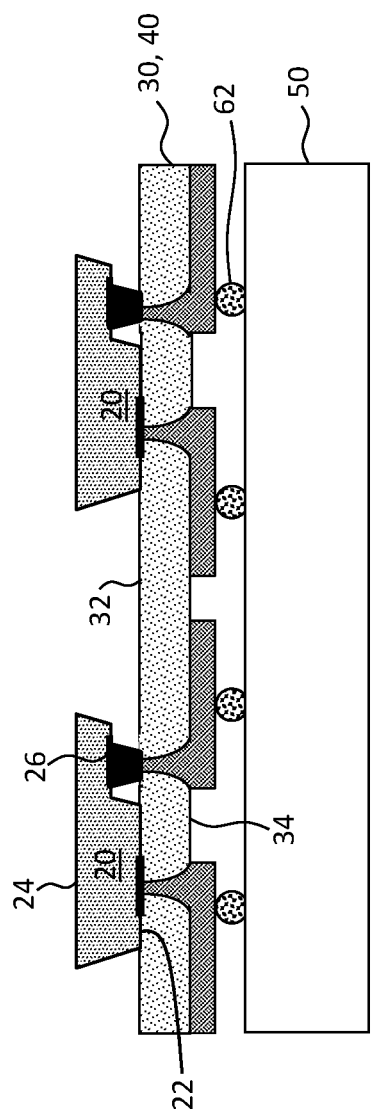
Figure 15J:
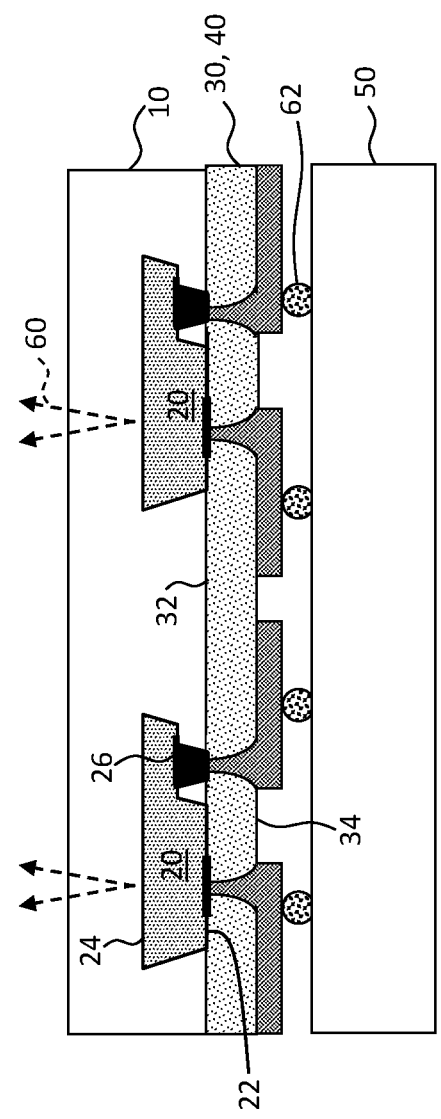

In step 110, an array 28 of light emitters 20 is provided, for example on one or more source substrates. Each light emitter 20 on a source substrate can be disposed over a sacrificial portion of the source substrate and physically connected to the source substrate by a tether attached to an anchor. Each light emitter 20 in array 28 of light emitters 20 (i) has an emission side 24 and an electrode side 22, (ii) comprises electrode contacts 26 wherein at least one electrode contact 26 is disposed on electrode side 22, and (iii) emits light 60 through emission side 24 when provided with power through electrode contacts 26. Array 28 of light emitters 20 is disposed in step 120 on redistribution layer 30 as shown in FIG. 15I (inverted), for example by micro-transfer printing, so that electrode side 22 of each of light emitters 20 in array 28 of light emitters 20 is adjacent to support side 32 and distribution contacts 36 are in electrical contact with electrode contacts 26. Optionally, in step 130 and as shown in FIG. 15J, mold compound 10 is coated over light emitters 20 and support side 32 of redistribution layer 30.

The process steps associated with FIGS. 15A-15J can be identical to steps described above and the structures can be the same, but are not necessarily so. The processes differ by patterning redistribution layer 30 before light emitters 20 or mold compound 10 is disposed. The choice of methods can be a matter of design choice. Those knowledgeable in the art will recognize that the steps described above (e.g., steps 100-190) can be, in some cases, performed in different orders and at different times and methods using such different orders are expressly contemplated in the present disclosure.

A further discussion of utilizing micro-assembly techniques (e.g., micro-transfer printing techniques) to assemble light emitters 20 in a display 99 that can be used in or adapted for use with some embodiments of the present disclosure can be found in U.S. patent application Ser. No. 14/822,868 filed Aug. 10, 2014, entitled Compound Micro-Assembly Strategies and Devices, the contents of which are incorporated by reference herein in its entirety. A discussion of micro-LEDs and micro-LED displays that can be used in or adapted for use in the present disclosure can be found in U.S. patent application Ser. No. 14/743,981, filed Jun. 18, 2015, entitled Micro Assembled Micro LED Displays and Lighting Elements, which is hereby incorporated by reference in its entirety.

A display 99 can be operated in a variety of useful ways. In one way, a controller (e.g., electrical device 50) provides power, a ground reference, and control signals to light emitters 20 through electrical connections 62 (e.g., solder balls 62), distribution contacts 36, any wires 38, and electrode contacts 26. The signals can provide a passive-matrix or active-matrix control of light emitters 20 in array 28. Light emitters 20 can be arranged in pixels and controlled as pixels in a display 99 (e.g., which is a display tile 99 in a larger display 99). In some embodiments, the pixels are controlled by electrical device 50 as an active-matrix or passive-matrix display 99. Electrical device 50 is connected to light emitters 20 through electrical connections 62 and distribution contacts 36 (for example at a relatively lower resolution), wires 38, and electrode contacts 26 (for example at a relatively higher resolution). In response to control signals from electrical device 50, light emitters 20 emit light, for example in an active-matrix or passive-matrix control configuration. Electrical devices 50 can receive control, power, or ground signals from an external display controller or other controller (not shown in the Figures) for example through cables or cable connectors.

Support 10 emission side 24 can comprise or be coated with one or more of an anti-reflection layer, a protective layer, and an encapsulating layer (not shown in the Figures). Support 10 can comprise optical structures, such as, for example, lenslets or light-scattering materials, molded into support 10 or applied to support 10, for example to modify the optical characteristics of light 60 emitted from display 99. Support 10 can have a size of a conventional display or display tile, for example a rectangle with a diagonal length of a few centimeters to one or more meters and a thickness of 50 microns to 10 mm or even more. Before, after, or at the same time, light emitters 20 (e.g. micro-LEDs) can be provided in step 110, using conventional photolithographic integrated-circuit processes on semiconductor substrates. Light emitters 20 that are micro-LEDs having semiconductor substrates can be much smaller than and separate, individual, discrete, and distinct from the support 10 or redistribution layer 30 and can include different materials.

As is understood by those skilled in the art, the terms "on," "over" and "under" are relative terms and can be interchanged in reference to different orientations of the layers, elements, and substrates included in the present invention. For example, a first layer on a second layer, in some implementations means a first layer directly on and in contact with a second layer. In other implementations, a first layer on a second layer includes a first layer and a second layer with another layer therebetween.

In this application, unless otherwise clear from context or otherwise explicitly stated, (i) the term "a" may be understood to mean "at least one"; (ii) the term "or" may be understood to mean "and/or"; (iii) the terms "comprising" and "including" may be understood to encompass itemized components or steps whether presented by themselves or together with one or more additional components or steps; (iv) the terms "about" and "approximately" may be understood to permit standard variation as would be understood by those of ordinary skill in the relevant art; and (v) where ranges are provided, endpoints are included.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions can be conducted simultaneously in some embodiments. The disclosure has been described in detail with particular reference to certain embodiments thereof, but it will be understood that variations and modifications can be effected within the spirit and scope of the claimed invention.

PARTS LIST 10 support/mold compound
12 support front surface
14 support back surface
20 light emitter
20R red-light emitter
20G green-light emitter
20B blue-light emitter
21 tether
22 electrode side
24 emission side
26 electrode contact
28 array
30 redistribution layer
32 support side
34 distribution side
35 distribution conductor
36 distribution contact
38 wire
40 black matrix
42 electrode contact pitch
44 distribution pad pitch
46 via
48 dielectric layer
50 electrical device
60 light
62 electrical connection/solder ball
70 carrier substrate
99 display/display tile
100 provide carrier substrate step
110 provide array of light emitters step
120 dispose light emitters on carrier substrate step
130 dispose mold compound on light emitters step
140 remove carrier substrate step
150 coat electrode side step
160 form vias step
170 form wires and distribution contacts step
180 dispose connections step
190 connect controller to distribution contacts step

The invention claimed is:

1. A method of making a display, comprising:
providing a carrier substrate;
providing an array of light emitters, wherein each of the light emitters in the array of light emitters (i) has an emission side and an electrode side, (ii) comprises electrode contacts wherein at least one of the electrode contacts is disposed on the electrode side, (iii) is disposed to emit light from the emission side when provided with power through the electrode contacts;
disposing the array of light emitters on the carrier substrate so that the electrode side of each of the light emitters in the array of light emitters is adjacent to the carrier substrate;
disposing a layer of optically transparent polymer over the array of light emitters, the optically transparent polymer forming a support having a support back surface and a support front surface, wherein the support back surface is substantially co-planar with the electrode side;
removing the carrier substrate; and
providing a redistribution layer having a support side and a distribution side, the support side disposed on and in contact with at least a portion of the support back surface, the redistribution layer comprising a dielectric layer and distribution contacts such that the distribution contacts are electrically connected to the electrode contacts of each of the light emitters and the distribution side is at least partially exposed.

2. The method of claim 1, comprising patterning a black matrix on the distribution side.

3. A method of making a display, comprising:
providing a carrier substrate;
disposing a redistribution layer comprising a dielectric layer on the carrier substrate, the redistribution layer having a support side and a distribution side in contact with the carrier substrate;
providing an array of light emitters, wherein each of the light emitters in the array of light emitters (i) has an emission side and an electrode side, (ii) comprises electrode contacts wherein at least one of the electrode contacts is disposed on the electrode side, and (iii) is disposed to emit light from the emission side when provided with power through the electrode contacts;
disposing the array of light emitters on the redistribution layer so that the electrode side of each of the light emitters in the array of light emitters is adjacent to the support side;
removing the carrier substrate; and
forming distribution contacts on the distribution side that extend through the dielectric layer and are in electrical contact with the electrode contacts.

4. The method of claim 3, comprising disposing a layer of optically transparent polymer over the array of light emitters and at least partly in contact with the support side.

5. The method of claim 3, comprising electrically connecting an electrical device to the distribution contacts.

6. The method of claim 5, comprising disposing the electrical device on or over the distribution side.

7. The method of claim 5, comprising disposing a black matrix over the distribution side.

8. A method of making a display, comprising:
providing a carrier substrate;
disposing a redistribution layer comprising a dielectric layer on the carrier substrate, the redistribution layer having a support side and a distribution side in contact with the carrier substrate;
forming distribution contacts on the distribution side;
providing an array of light emitters, wherein each of the light emitters in the array of light emitters (i) has an emission side and an electrode side, (ii) comprises electrode contacts wherein at least one of the electrode contacts is disposed on the electrode side, and (iii) is disposed to emit light through the emission side when provided with power through the electrode contacts;
disposing the array of light emitters on the redistribution layer so that the electrode side of each of the light emitters in the array of light emitters is adjacent to the support side and the electrode contacts are in electrical contact with the distribution contacts through the dielectric layer; and
removing the carrier substrate.

9. The method of claim 8, comprising disposing a layer of optically transparent polymer over the array of light emitters and at least partly in contact with the support side.

10. The method of claim 8, comprising electrically connecting an electrical device to the distribution contacts.

11. The method of claim 8, comprising disposing the electrical device on or over the distribution side.

12. The method of claim 8, comprising disposing a black matrix over the distribution side.

\* \* \* \* \*